US00RE35723E

United States Patent [19]

Takasugi

[11] E Patent Number: Re. 35,723

[45] Reissued Date of Patent: Feb. 3, 1998

[54] SYNCHRONOUS BURST-ACCESS MEMORY

[75] Inventor: Atsushi Takasugi, Tokyo, Japan

[73] Assignee: Oki Electric Industry Co., Ltd., Tokyo, Japan

[21] Appl. No.: 565,958

[22] Filed: Dec. 4, 1995

Related U.S. Patent Documents

Reissue of:

[64] Patent No.: 5,268,865
Issued: Dec. 7, 1993
Appl. No.: 735,626
Filed: Jul. 24, 1991

[30] Foreign Application Priority Data

Jul. 25, 1990 [JP] Japan ..... 2-196877
Sep. 28, 1990 [JP] Japan ..... 2-259697

[51] Int. Cl.[6] ..... G11C 7/00

[52] U.S. Cl. ..... 365/189.05; 365/236; 365/233

[58] Field of Search ..... 365/189.05, 236, 365/233, 230.08, 230.06

[56] References Cited

U.S. PATENT DOCUMENTS

| | | | |
|---|---|---|---|
| 4,513,372 | 4/1985 | Ziegler | 364/200 |
| 4,608,678 | 8/1986 | Threewitt | 365/189.05 |
| 4,829,484 | 5/1989 | Arimoto | 365/189.05 |
| 4,891,791 | 1/1990 | Iijima | 365/189.05 |
| 4,928,265 | 5/1990 | Higuchi | 365/189.05 |
| 4,984,217 | 1/1991 | Sato | 365/230.02 |
| 5,003,510 | 3/1991 | Kamisaki | 365/189.05 |
| 5,016,226 | 5/1991 | Hiwada | 365/189.05 |
| 5,111,386 | 5/1992 | Fujishima | 365/189.05 |

FOREIGN PATENT DOCUMENTS

| | | |
|---|---|---|
| 0135940 | 4/1985 | European Pat. Off. . |
| 225995 | 9/1988 | Japan . |
| 8933 | 1/1990 | Japan . |

OTHER PUBLICATIONS

Electronic Design, vol. 36, No. 19, Aug. 25, 1988, pp. 93–96—Shakaib Iqbal, "Internally Timed RAMs Build Fast Writable Control Stores".

*Primary Examiner*—A. Zarabian
*Attorney, Agent, or Firm*—Spencer & Frank

[57] ABSTRACT

A synchronous burst-access memory latches a row address strobe signal, a column address strobe signal, and address signals in synchronization with a clock signal. Data are stored in rows and columns in a memory cell array. Data in a selected row are input and output in serial bursts in synchronization with the clock signal, starting from a selected column. The row and initial column address are provided as external inputs; subsequent column addresses are generated by an internal address counting circuit. A word-line driving circuit for a synchronous memory uses transparent latches to latch the row address strobe signal and address signals, enabling row address decoding to be completed prior to synchronization with the clock signal.

59 Claims, 25 Drawing Sheets

SYNCHRONOUS BURST-ACCESS MEMORY

Matter enclosed in heavy brackets [ ] appears in the original patent but forms no part of this reissue specification; matter printed in italics indicates the additions made by reissue.

BACKGROUND OF THE INVENTION

This invention relates to a type of dynamic random-access memory (dynamic RAM, or DRAM) that is written and read in high-speed bursts synchronized with a clock signal. This novel type of memory will be referred to below as a synchronous burst-access memory.

A synchronous burst-access memory can be compared to the well-known dual-port random-access memory (dual-port RAM). A dual-port RAM basically comprises an array of DRAM memory cells and a data register. The memory cells can be accessed "at random" by latching a row address, then a column address, and reading or writing the bit or bits located at the intersection of the row and column. Alternatively, an entire row of bits can be transferred at once to the data register, then read serially in synchronization with a clock signal. Some dual-port RAMs enable data to be written serially as well as read. Serial and random access can be carried out simultaneously, and serial access can be performed at high speed.

Dual-port RAM has often been used to store image data which are read serially to generate a video signal for a raster-scan display. More recently, dual-port RAM has been used in systems employing processors of the reduced instruction-set type (so-called RISC processors), which run at high speeds and often require access to a series of bits.

A drawback of dual-port RAM is that complex on-chip circuitry is required to control two ports simultaneously. This leads to chip sizes 40% to 50% larger than general-purpose DRAM, and increases the cost of manufacturing and testing the chip.

Another drawback is that the control and address signals supplied to dual-port RAM have stringent and interrelated setup, hold, and other timing requirements, which are not easily satisfied at high operating speeds. This problem is particularly acute when the same control signals are supplied to a plurality of memory devices on a printed circuit board. Board design becomes difficult and powerful signal drivers become necessary; but these drivers generate unwanted electrical noise that can cause other devices on the board to malfunction.

Timing would be easier if all control and address signals were synchronized to a single clock signal, but existing dual-port RAM devices make no provision for this type of synchronization; the clock signal is used only to synchronize serial data output, or serial input and output. Synchronous static RAM devices are known, but their synchronization schemes are not directly applicable to dynamic RAM because row and column addresses are multiplexed in dynamic RAM, whereas they are not multiplexed in static RAM. In addition, if existing static RAM synchronization schemes were to be applied to dynamic RAM, operations such as row address decoding would not begin until after input of the synchronizing clock edge, which would lead to delays inappropriate for a burst-access device.

SUMMARY OF THE INVENTION

It is accordingly an object of the present invention to synchronize address signals, control signals, and data input and output to a single clock signal.

Another object of the invention is to reduce memory size and cost.

Yet another object of the invention is to facilitate the use of memory in multiple-processor systems.

Still another object of the invention is to facilitate the use of memory by different types of processors.

A further object of the invention is to facilitate image-processing operations.

An additional object of the invention is to enable rapid word-line driving in a synchronous memory.

A synchronous burst-access memory comprises a memory cell array having memory cells disposed in intersecting rows and columns for storing data, and a latching means for latching a row address strobe signal, a column address strobe signal, and address signals in synchronization with a clock signal. The latching means also generates first and second internal control signals from the latched signals.

An input/output means performs external input and output of data in synchronization with the clock signal.

A row address decoding means decodes the address signals and selects a row of memory cells in the memory cell array in response to the first internal control signal.

An address counting means is preset to a value determined by the address signals in response to the second internal control signal. The address counting means then counts the clock signal and generates a consecutive series of column addresses starting from the preset value. A column address decoding means decodes the series of column addresses and selects corresponding columns in the memory cell array.

A data transfer means transfers data from the input/output means to the memory cell array and from the memory cell array to the input/output means. The data are transferred to and from memory cells disposed in columns selected by the column address decoding means, in the row selected by the row address decoding means.

A word-line driving circuit for a synchronous memory uses transparent latches to latch the row address strobe signal and address signals, enabling row address decoding to be completed prior to synchronization with the clock signal.

DETAILED DESCRIPTION OF THE INVENTION

Eight embodiments of the invented burst-access synchronous memory will be described with reference to FIGS. 1 to 20, and then a novel word-line driving device for use in synchronous dynamic RAM will be described with reference to FIGS. 21 and 22. The drawings are intended to illustrate the invention but not to limit its scope, which should be determined solely from the appended claims.

Figure 1:
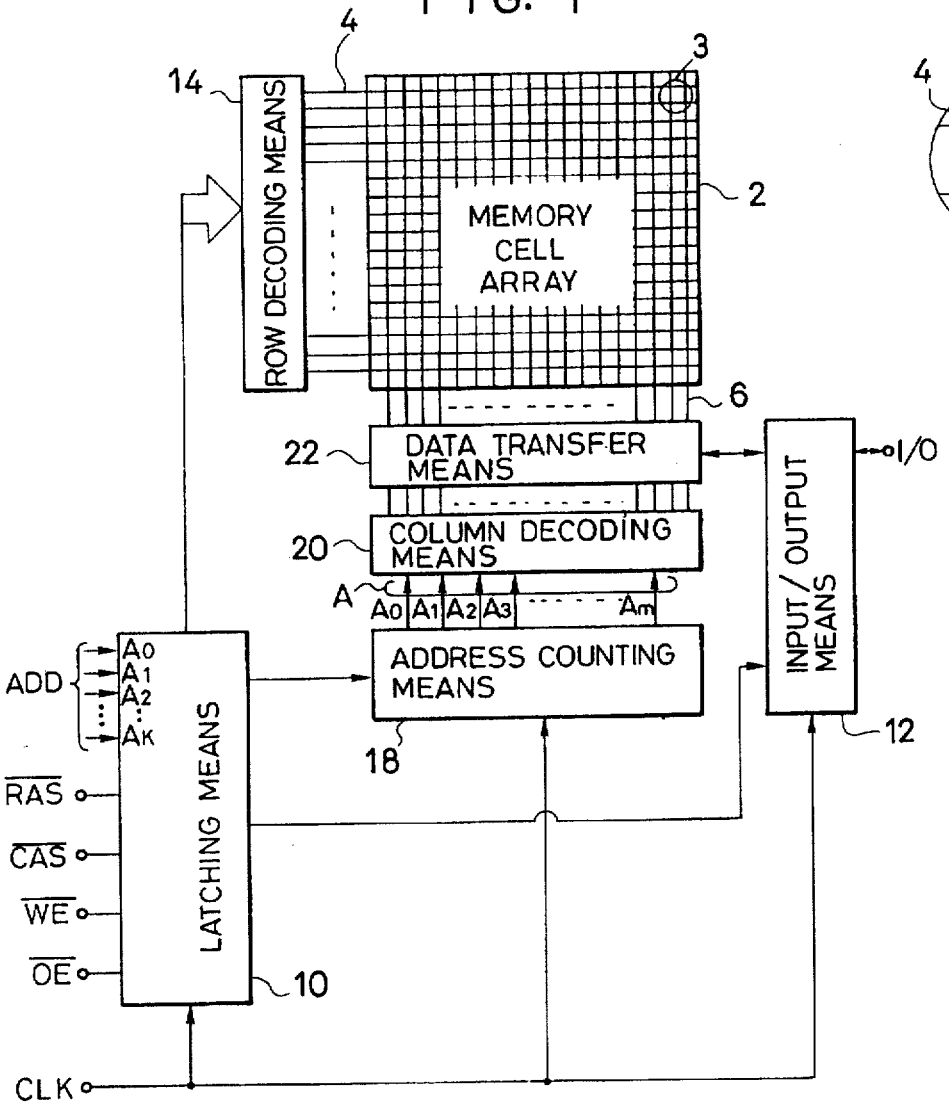
FIG. 1 is a block diagram of a first novel synchronous burst-access memory.
Figure 1A:
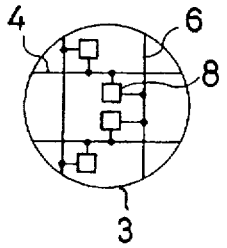
FIG. 1A illustrates a portion of the memory cell array shown in FIG. 1 in enlarged form.

With reference to FIG. 1, a first novel synchronous burst-access memory comprises a memory cell array 2 having memory cells disposed in intersecting rows and columns. In the drawing, rows are represented by horizontal word lines 4 and columns by vertical bit lines 6. Dynamic random-access memory cells 8 are disposed near the intersections of the bit lines and word lines, as shown in FIG. 1A for example. FIG. 1A illustrates the circled region identified by reference number 3 in FIG. 1 in enlarged form. The memory cell array also comprises sense amplifiers and other well-known devices not explicitly shown in the drawings.

The novel memory also has a latching means 10, clocked by a clock signal CLK, for receiving and latching a row address strobe signal $\overline{RAS}$, a column address strobe signal $\overline{CAS}$, and address signals $A_0, A_1, A_2, \ldots, A_k$, which are carried on an external address bus ADD. The memory must also receive one or more signals for differentiating between read access and write access. In FIG. 1 the latching means 10 receives and latches for this purpose a write enable signal $\overline{WE}$ and an output enable signal $\overline{OE}$.

A novel feature of the invention is that $\overline{RAS}$, $\overline{CAS}$, $\overline{WE}$, $\overline{OE}$, and the address signals $A_0, \ldots, A_k$ are all latched on rising or falling edges of the clock signal CLK. The external circuits that generate $\overline{RAS}$, $\overline{CAS}$, $\overline{WE}$, $\overline{OE}$, and the address signals accordingly need only satisfy setup and hold time requirements with respect to CLK, instead of having to meet the complex, interrelated timing requirements of conventional dynamic RAM or dual-port RAM. As a result there are comparatively liberal margins for timing skew, and timing requirements can be met by external signal-driving circuits of only moderate output, even at high clock speeds. Prior-art problems of noise on printed circuit boards can therefore be avoided.

The latching means 10 comprises latch circuits for latching the above-mentioned input signals, and further circuitry for passing the latched input signals to other parts of the burst-access synchronous memory, and for generating various control signals from the latched input signals. Transparent latches can be used advantageously, as will be shown later in FIGS. 21 and 22.

The invention is not restricted to the signals shown in FIG. 1. There may be two column address strobe signals ( $\overline{UCAS}$ and $\overline{LCAS}$, for strobing an upper and lower column address), for example, or two write enable signals ($\overline{UWE}$ and $\overline{LWE}$). Alternatively, $\overline{WE}$ and $\overline{OE}$ may be replaced by a single read/write signal (R/$\overline{W}$). The necessary modifications will be obvious to one skilled in the art.

An input/output means 12, also clocked by the clock signal CLK, is connected to and controlled by the latching means 10. The input/output means has a data I/O port (marked I/O in the drawings) via which data are input to and output from the memory in serial fashion, synchronized with CLK. When not used for data input or output, the I/O port is placed in the high-impedance state.

The I/O port may comprises a single signal line as shown in the drawing, in which case only one data bit is input or output at a time. Alternatively, the I/O port may comprise more than one signal line, in which case two or more data bits are input or output simultaneously. The number of bit lines (actually bit line pairs) per column in the memory cell array equals the number of data lines in the I/O port.

A row address decoding means 14 connected to the memory cell array 2 and the latching means 10 receives the latched address signals $A_0, \ldots, A_k$ and a first internal control signal from the latching means 10, decodes the address information, thereby selects one of the word lines 4, and drives this word line, thus selecting a row of memory cells in the memory cell array 2. The first internal control signal, which controls the time at which these operations are carried out, is generated from the row address strobe signal $\overline{RAS}$ and the clock signal CLK. Alternatively, $\overline{RAS}$ and CLK may be passed directly to the address decoding means 14 as the first internal control signal.

An address counting means 18 is connected to and controlled by the latching means 10 and receives the clock signal CLK. By counting CLK pulses, the address counting means 18 generates a consecutive series of column address (A) starting from a preset address as will be described later. Each address A comprises m address bits $A_0, A_1, A_2, \ldots, A_m$. The address counting means 18 thus operates as a presettable (m+1)-bit counter. The number of address bits $A_0, \ldots, A_m$ generated is equal to or greater than the number of address bits $A_0, \ldots, A_k$ latched by the latching means 10.

A column address decoding means 20 connected to the address counting means 18 decodes the column addresses output by the address counting means 18 and selects corresponding columns in the memory cell array 2, selecting one column at a time.

A data transfer means 22, connected to the memory cell array 2, the input/output means 12, and the column address decoding means 20, transfers data from the memory cell array 2 to the input/output means 12, and from the input/output means 12 to the memory cell array 2. The data are transferred to and from only those memory cells 8 disposed in the column selected by the column address decoding means 20, in the row selected by the row address decoding means 14. Data are thus transferred to or from a consecutive series of column positions in the row, one column position at a time.

Figure 2:
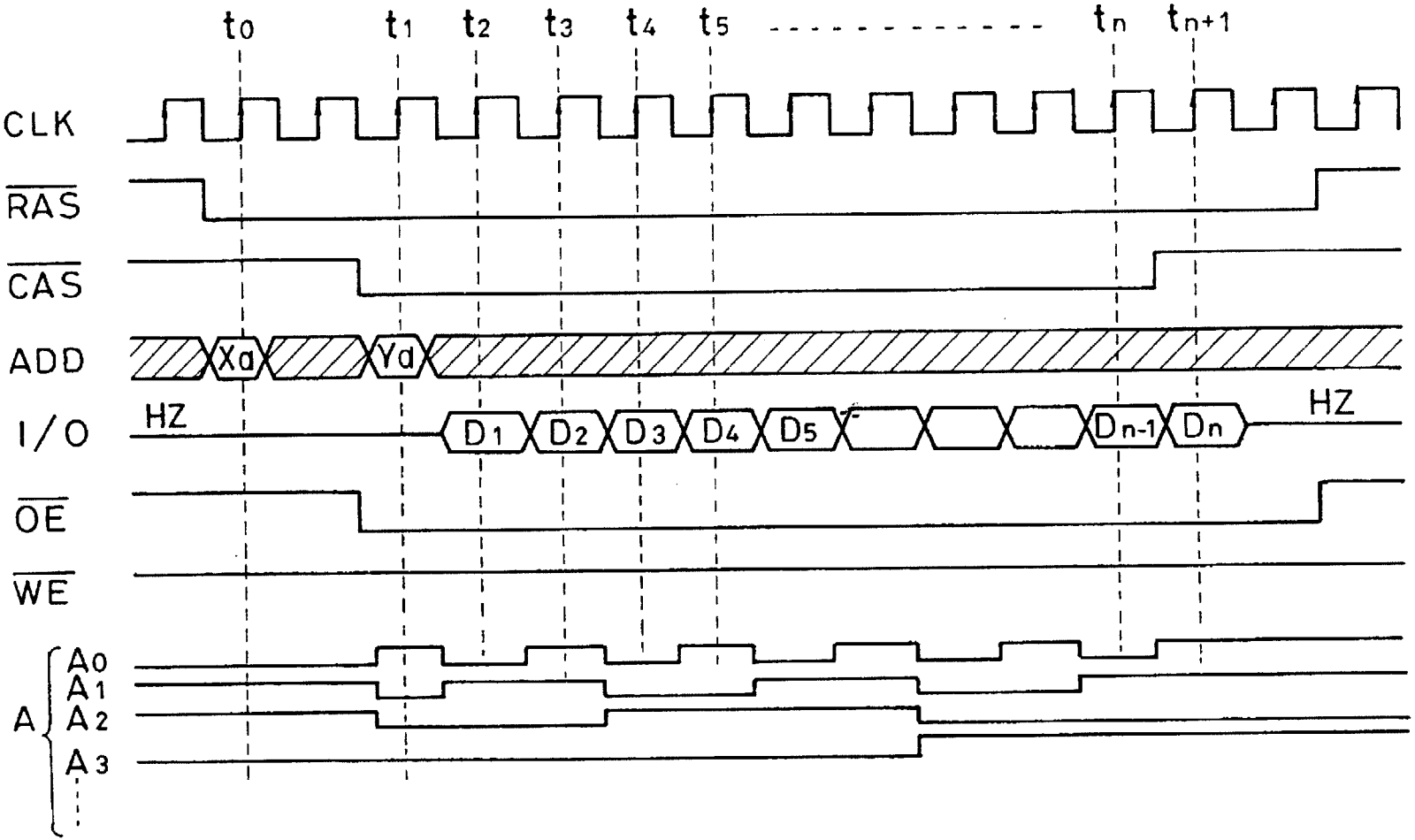
FIG. 2 is a timing diagram illustrating the operation of the first novel memory.

The operation of this memory will be explained with reference to FIG. 2, which illustrates a burst read access.

To read data from the novel memory, an external device such as a processor begins by driving $\overline{RAS}$ low (active) and sending a row address Xa on the address bus ADD. At time $t_0$ the latching means 10 latches $\overline{RAS}$ and the row address Xa. The row address decoding means 14 decodes Xa and selects one of the word lines 4 in the memory cell array 2.

This and other latching operations are shown synchronized to rising edges of the clock signal CLK, but the invention is of course not restricted to the rising edge; synchronization may be with the falling edge instead, or with both edges.

Next the processor drives $\overline{CAS}$ and $\overline{OE}$ low (active) and sends a column address Ya on the address bus ADD. At time $t_1$ the latching means 10 latches $\overline{CAS}$ and $\overline{OE}$ and sets the value of Ya in the address counting means 18. The column address Ya may be latched in the latching means 10, using a latch separate from the latch that holds the row address Xa. Alternatively, the column address Ya may be passed directly through the latching means 10 to the address counting means 18. In either case, the column address Ya is passed to the address counting means 18 together with a second internal control signal commanding the address counting means 18 to preset to the value Ya. The second internal control signal can be generated from $\overline{CAS}$ and CLK: for example, from the first rising edge of CLK after $\overline{CAS}$ goes low.

If the number of address bits $A_0, \ldots, A_m$ output from the address counting means 18 exceeds the number of address bits $A_0, \ldots, A_k$ received by the latching means 10, the column address Ya is set in the k+1 most significant bits of the m+1 bits of the address counting means 18, and the other bits are cleared to zero. From $\overline{CAS}$ and $\overline{OE}$ the latching means 10 also generates and sends to the input/output means 12 a signal commanding the input/output means 12 to commence output operations.

The column address decoding means 20 decodes the column address $A_0, \ldots, A_m$ output by the address counting means 18, thereby selecting one column in the memory cell array. The data transfer means 22 transfers the data $D_1$ in the memory cell or cells at the intersection of this column and the row selected by the row address decoding means 14 to the input/output means 12 for output at the I/O port. The processor can latch the data $D_1$ at time $t_2$.

The address counting means 18 now increments by one, selecting the next column, and the data $D_2$ in this column in the selected row are output in the same way at time $t_3$. Operation continues in this way at times $t_4$, [$T_5$] $t_5, \ldots, t_n$. At each CLK cycle the address counting means 18 increments by one and a new column of data in the same row is output.

After receiving data n−1 times, the processor drives $\overline{CAS}$ high (inactive) again. At time $t_{n+1}$ the latching means 10 latches the inactive $\overline{CAS}$ signal and sends the input/output means 12 an internal control signal commanding it discontinue output operations. When the last data $D_n$ has been output, the input/output means 12 places the I/O port in the high-impedance state, denoted HZ in the drawings. The processor then drives $\overline{RAS}$ and $\overline{OE}$ high (inactive) to end the burst access.

To write data to the novel memory, the processor follows a similar procedure except that it leaves $\overline{OE}$ high and drives $\overline{WE}$ low, causing the input/output means 12 to perform input instead of output. Data provided by the processor in synchronization with the clock signal CLK are transferred from the I/O port via the data transfer means 22 to successive columns of memory cells in the selected row in the memory cell array 2.

If the I/O port consists of a single signal line, then each of the data $D_1, \ldots, D_n$ consists of a single bit. If the I/O port consists of multiple signal lines, then each of the data $D_1, \ldots, D_n$ consists of multiple bits.

In its simplest and generally preferable form the data transfer means 22 comprises only gating means for connecting bit lines 6 in the selected column to the input/output means 12. If necessary, however, the data transfer means 22 may have a data register as in conventional dual-port RAM. In this case an entire row of data is transferred from the selected word line to the data transfer means 22 at the beginning of the burst access, between times $t_0$ and $t_1$ in FIG. 2, and stored in the data register. The data in the data register are then written or read at times $t_1$ to $t_{n+1}$. For write access, after time $t_{n+1}$ the entire row of data is transferred back from the data transfer means 22 to the selected row in the memory cell array 2.

Since address signals ($A_o, \ldots, A_k$) and control signals ($\overline{RAS}$, $\overline{CAS}$, $\overline{WE}$, $\overline{OE}$) are sent to the memory only once per burst, access takes place much more rapidly than with conventional dynamic RAM, new data being obtained in every clock cycle. Since the novel memory has only one port, it is smaller, simpler, and less expensive to manufacture and test than conventional dual-port RAM. It is also simpler to control.

Unlike conventional dual-port RAM, the novel memory does not enable random and serial access to be performed simultaneously. Many personal computer systems and other systems that employ dual-port RAM do not need to access the two ports simultaneously, however. Such systems will obtain significant cost benefits from using the novel memory.

Figure 3:
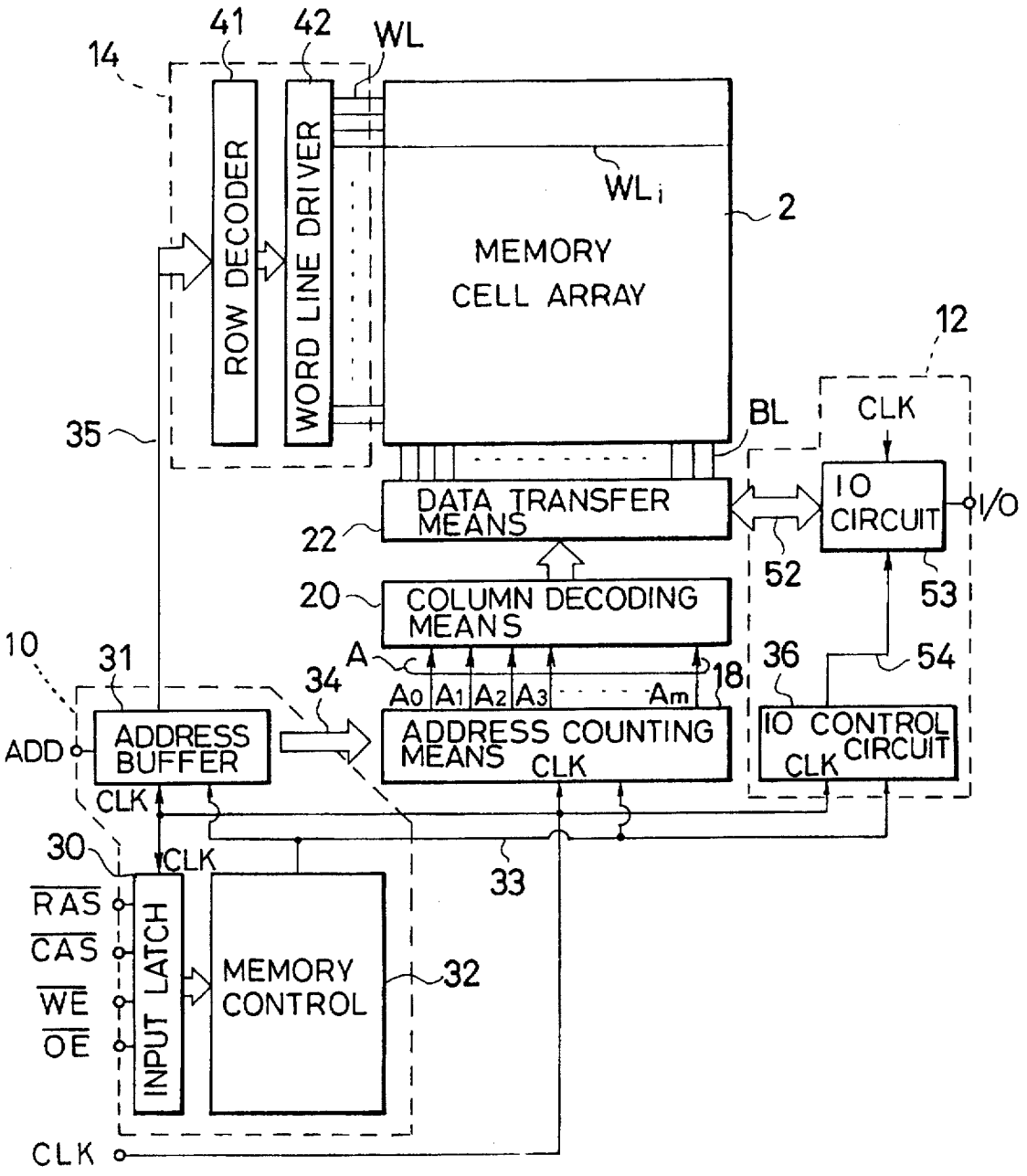
FIG. 3 is a more detailed block diagram of the first novel memory.

FIG. 3 is a somewhat more detailed block diagram of the first novel memory. FIG. 3 is shown mainly to relate the foregoing description to the descriptions of subsequent novel memories, in which further elements will be added.

In FIG. 3 the latching means 10 is shown to comprise an input latch circuit 30 for latching $\overline{RAS}$, $\overline{CAS}$, $\overline{WE}$, and $\overline{OE}$, and an address buffer 31 connected to the external address bus ADD for latching address signals. A memory control signal generating circuit 32 connected to the output side of the input latch circuit 30 generates internal control signals, and controls the address buffer 31 so that row addresses are sent to the row address decoding means 14 and column addresses to the address counting means 18. Control signals from the memory control signal generating circuit 32 are conveyed to the address buffer 31, the address counting means [22] *18*, and the input/output means 12 via several signal lines which are shown for convenience in the drawings as a single signal line 33.

The output side of the address buffer 31 is connected via an internal column address bus 34 to the address counting means 18, and via an internal row address bus 35 to the row address decoding means 14. The row address decoding means 14 comprises a row address decoder 41 and a word-line driver 42. The row address decoder 41 decodes the row address received from the address buffer and selects one of the word lines, such as $WL_i$ in the drawing. The word-line driver 42 drives the selected word line $WL_i$.

The input/output means 12 comprises an input/output control circuit 36 and an input/output circuit 53, both of which receive the clock signal CLK. The input/output circuit 53 is connected to the data transfer means 22 via an internal data bus 52 comprising one or more data lines, which are connected via well-known buffer circuits not explicitly shown in the input/output circuit 53 to the equal number of data lines in the I/O port. The input/output control circuit 36 receives control signals from the memory control signal generating circuit 32 via the signal line 33, and sends further control signals to the input/output circuit 53 via a signal line 54. These further control signals place the input/output circuit 53 in the input state, the output state, or a high-impedance state in which neither input nor output is performed.

Figure 4:
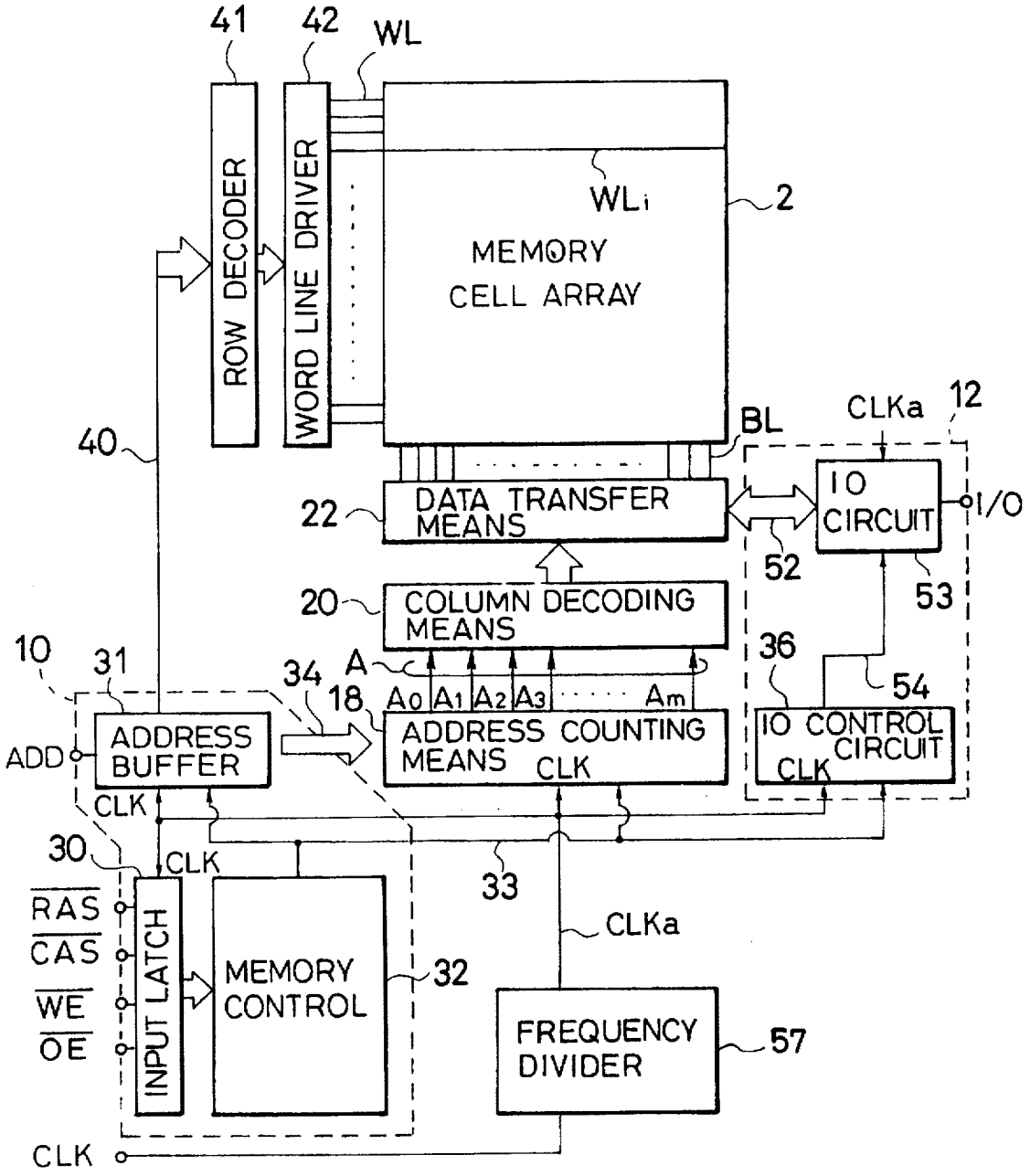
FIG. 4 is a block diagram of a second novel synchronous burst-access memory.

FIG. 4 is a block diagram of a second novel synchronous burst-access memory. Elements identical to elements in FIG. 3 are identified by the same reference numerals.

The second novel memory differs from the first novel memory in having a frequency divider 57 that receives the clock signal CLK, divides its frequency by a factor N (where N is a positive integer), thus generates an internal clock signal CLKa, and supplies CLKa in place of CLK to the input latch circuit 30, the address buffer 31, the address counting means 18, the input/output control circuit 36, and the input/output circuit 53. Frequency dividing circuits are well known, so a detailed description will be omitted. The frequency division ratio N can be selected by one or more external control signals not shown in the drawing. Alternatively, N can be permanently selected when the memory is fabricated, by a manufacturing option such as a metalization mask option, laser trimming option, or wire bonding option.

Figure 5:
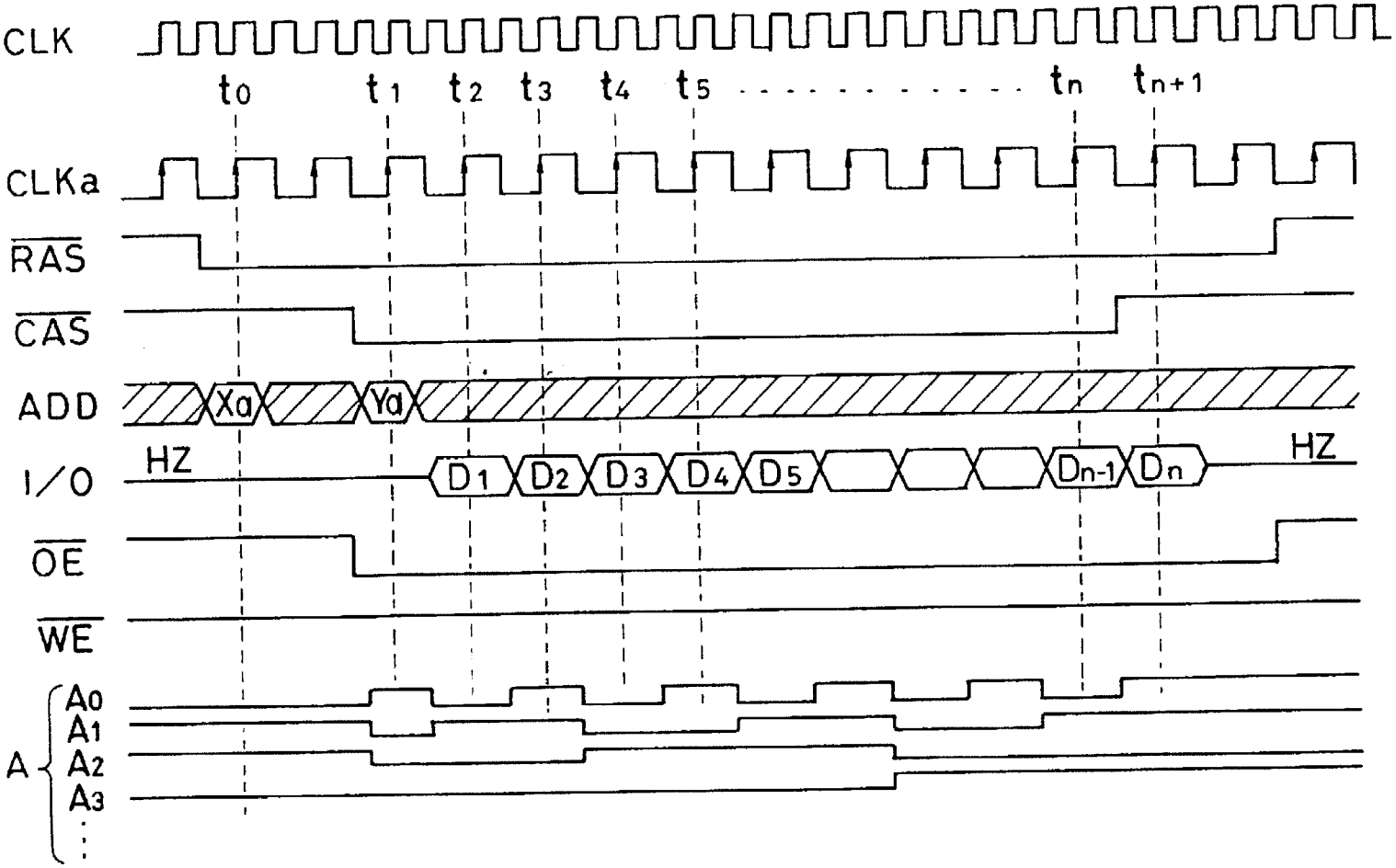
FIG. 5 is a timing diagram illustrating the operation of the second novel memory.

FIG. 5 illustrates burst access for the case of N=2. For convenience the external clock signal CLK is shown as having twice the frequency of the CLK signal in FIG. 2. The CLKa signal obtained by dividing the frequency of CLK by two accordingly has the same frequency in FIG. 5 as CLK in FIG. 2. The burst access shown in FIG. 5 is identical to that in FIG. 2 except that CLK is replaced by CLKa.

While some processors sue capable of completing one memory access in every clock cycle, others require two or more clock cycles per access. The frequency divider 57 enables the novel memory in FIG. 4 to be easily adapted for use with processors having different access speeds. Users will benefit by not having to provide a separate clock-dividing circuit. Manufacturers will benefit by being able to offer a single memory device suitable for a wide range of applications.

If the frequency division ratio N is controllable by external signal input, the second novel memory can be used in a system having two or more processors that access memory at different speeds. When accessing the memory, each processor selects the appropriate value of N by driving the external control signal or signals to the appropriate levels.

Figure 6:
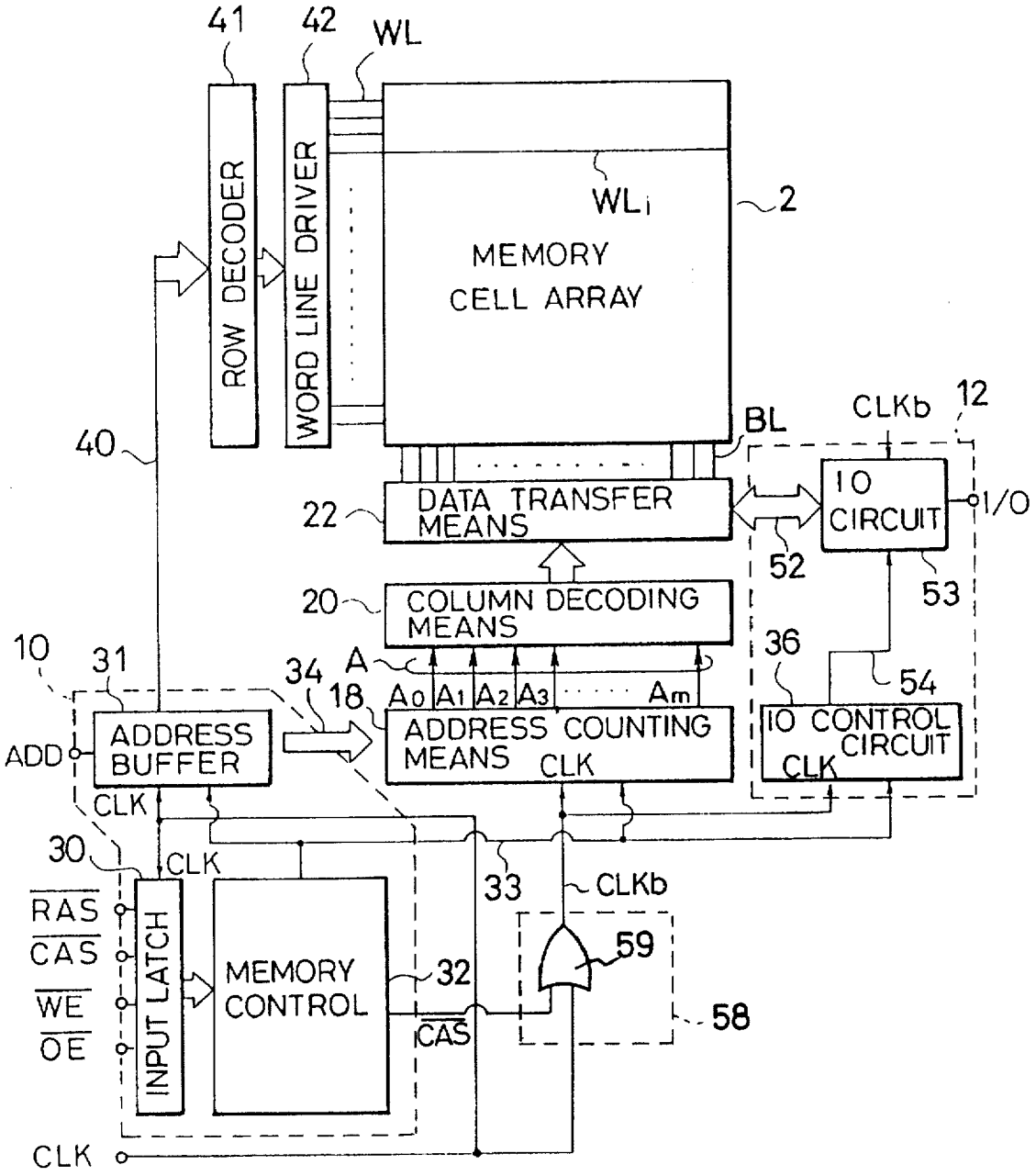
FIG. 6 is a block diagram of a third novel synchronous burst-access memory.

FIG. 6 is a block diagram of a third novel synchronous burst-access memory. Elements identical to elements in FIG. 3 are identified by the same reference numerals.

The third novel memory has, in addition to the circuit elements shown in FIG. 3, a clock control circuit 58 for blocking input of the clock signal CLK to the address counting means 18 and the input/output means while $\overline{CAS}$ is high. The clock control circuit comprises, for example, a two-input OR gate 59: one input receives CLK; the other receives $\overline{CAS}$ from the memory control signal generating circuit 32. The output CLKb of the OR gate 59 is thus high whenever $\overline{CAS}$ is high, and is identical to CLK when $\overline{CAS}$ is low. CLKb is supplied to the address counting means 18, the input/output control circuit 36, and the input/output circuit 53 in place of CLK.

Figure 7:
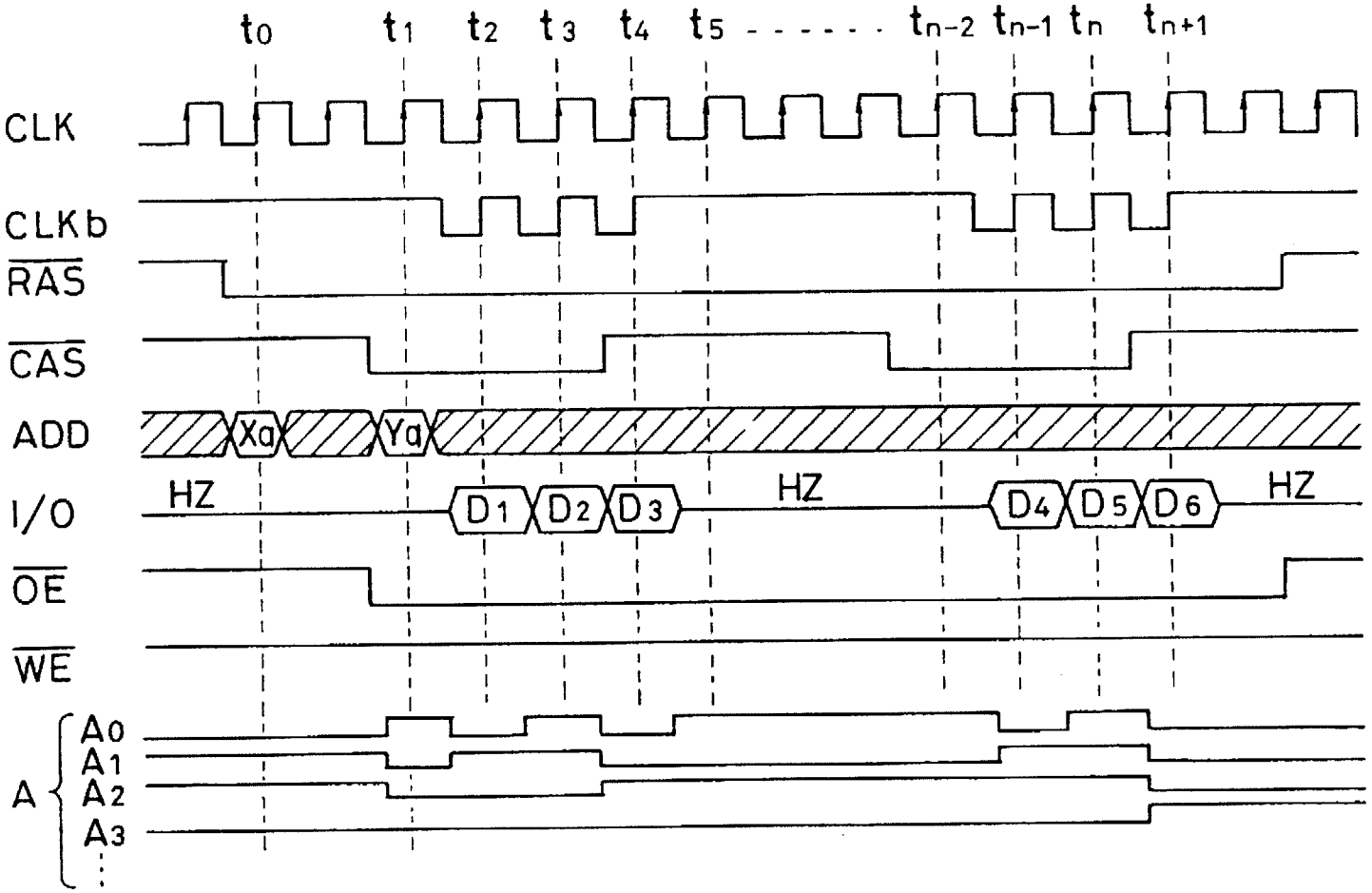
FIG. 7 is a timing diagrams illustrating the operation of the third novel memory.

FIG. 7 illustrates a burst read access for the third novel memory. $\overline{CAS}$ is initially held low for substantially three CLK cycles, causing the clock control circuit 58 to generate three CLKb pulses. Data $D_1$, $D_2$, and $D_3$ are output and the address counting means 18 increments three times. Next $\overline{CAS}$ is held high for substantially four CLK cycles, causing CLKb to remain high for a similar interval. During this interval the address counting means 18 does not increment, and a third internal control signal generated by the memory control signal generating circuit 32 causes the input/output control circuit 36 to place the input/output circuit 53 in the high-impedance state. $\overline{RAS}$ remains low; the same word line remains selected in the memory cell array 2. Next $\overline{CAS}$ is driven low for three CLK cycles again, causing three more CLKb pulses to be produced, the address counting means 18 to increment three times, and the data $D_4$, $D_5$, and $D_6$ to be output. Finally, both $\overline{CAS}$ and $\overline{RAS}$ are driven high, ending the burst access.

Write access is similar to read access except that $\overline{WE}$ is driven low instead of $\overline{OE}$.

The third novel memory is particularly useful in systems in which the same data bus is shared by two or more processors or other bus-master devices. While a first processor is engaged in a long burst access, a second processor may obtain use of the bus by asking the first processor to release the bus temporarily. The first processor does so by driving $\overline{CAS}$ high. When the second processor has finished using the bus, the first processor continues its access by driving $\overline{CAS}$ low again without having to generate new address information.

Figure 8:
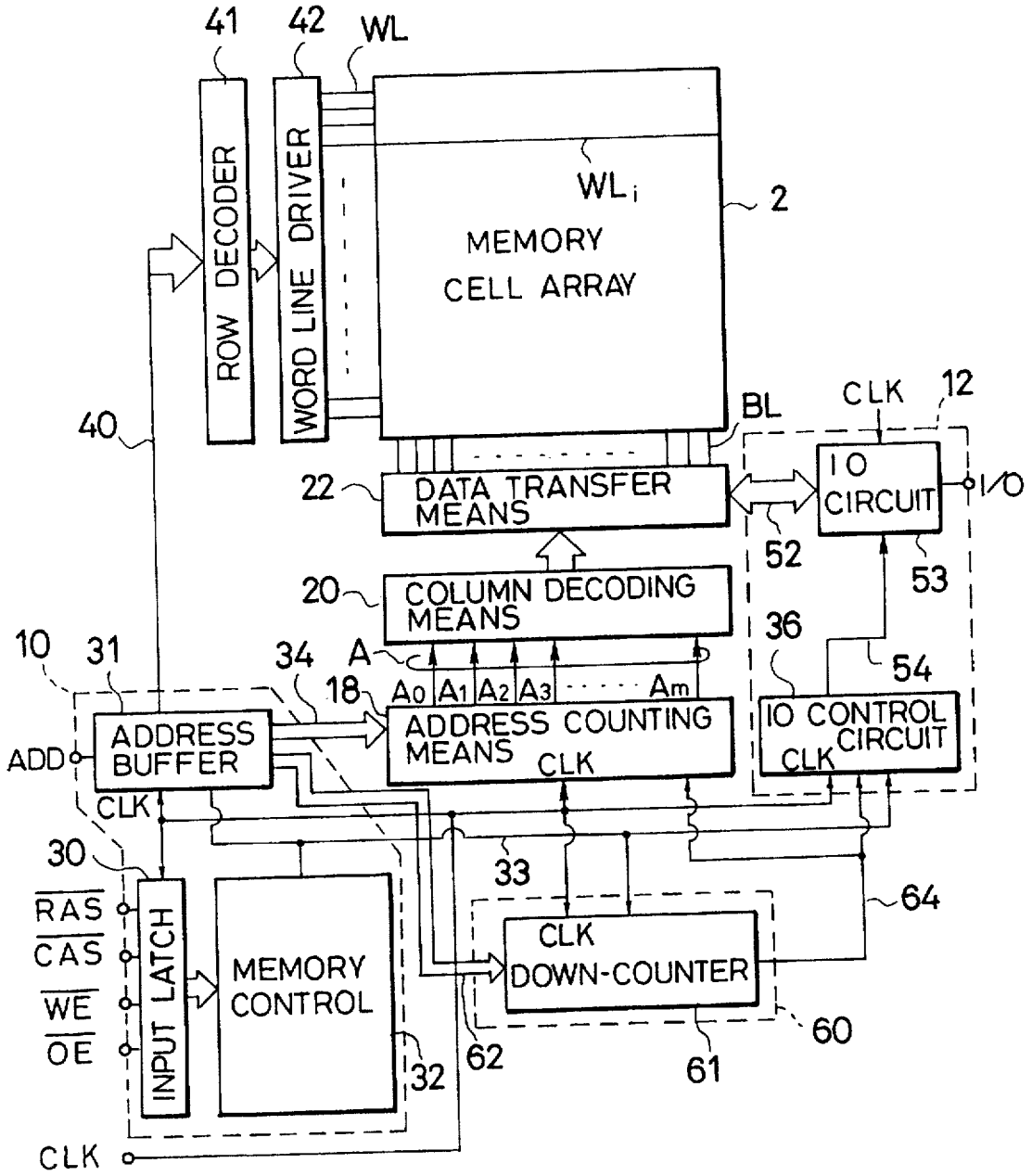
FIG. 8 is a block diagram of a fourth novel synchronous burst-access memory.

FIG. 8 is a block diagram of a fourth novel synchronous burst-access memory. Elements identical to elements in FIG. 3 are identified by the same reference numerals.

The fourth novel memory has an access counting means 60 for counting clock signals and halting input or output when a predetermined number of accesses have been performed. In FIG. 8 the access counting means 60 comprises a down-counter 61 connected to the address buffer 31 via an internal address bus 62, to the memory control signal generating means 32 via the signal line 33, and to the address counting means 18 and the input/output control circuit 36 via a signal line 64. The down-counter 61 preferably has the same bit width as the address counting means 18.

In this fourth novel memory the bit width of the external address bus ADD differs from the bit width of the address counting means 18 and the down-counter 61. As an example, it will be assumed that m=k+2.

When $\overline{CAS}$ becomes active for the first time after $\overline{RAS}$ becomes active, the value $A_o, \ldots, A_k$ input to the address buffer 31 on the next rising edge of CLK presets the most significant bits of the address counting means 18, the two remaining bits $A_{k+1}$ and $A_{k+2}$ of the address counting means 18 being cleared to zero as mentioned earlier. After this, while $\overline{RAS}$ remains active, if $\overline{CAS}$ becomes inactive, then active for a second time, the value $A_o, \ldots, A_k$ input to the address buffer 31 on the next rising edge of CLK presets the k+1 most significant bits of the down-counter 61, without affecting the remaining bits of the down-counter 61. These presetting operations are controlled by internal control signals provided by the memory control signal generating means 32.

Figure 9A:
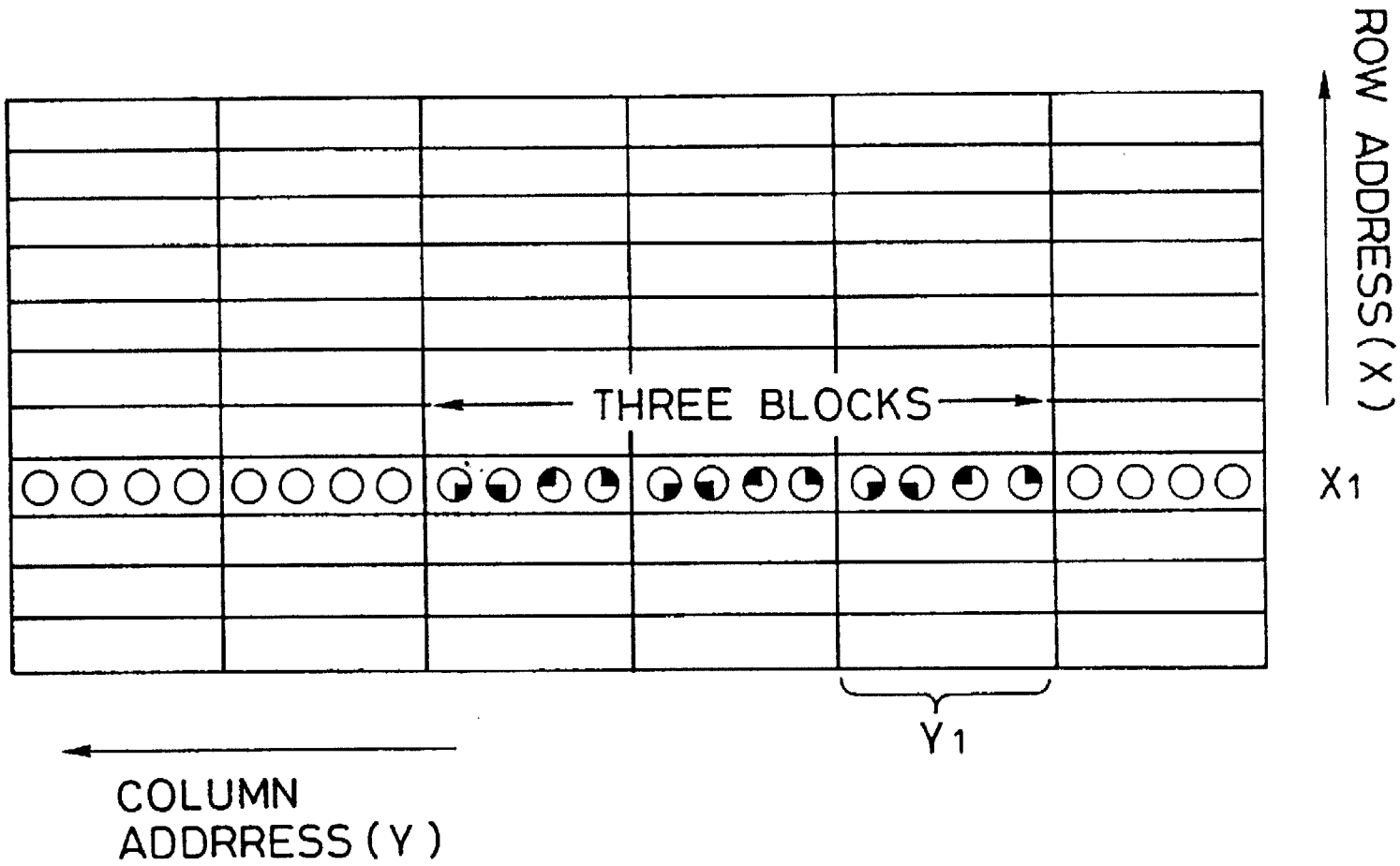
FIG. 9A illustrates a block addressing scheme.

FIG. 9A shows the address structure of the memory cell array 2 in the fourth novel memory. For simplicity it will be assumed that the I/O port and the internal data bus [51] *52* consist of only a single data line each, so that the memory cell array 2 has one bit per column. This is not a restriction on the invention; the structure can easily be extended to multiple bits per column.

A given row address X input to the memory designates a single word line, but a (k+1)-bit column address Y designates four bits (four columns) in that word line, such a group of four bits being referred to herein as a block. The four bits in the block corresponding to row address $X_1$, column address $Y_1$ are identified by circles with different quadrant markings, and bits in the two succeeding blocks are similarly identified. Burst access to these twelve bits will be illustrated next.

Figure 9B:
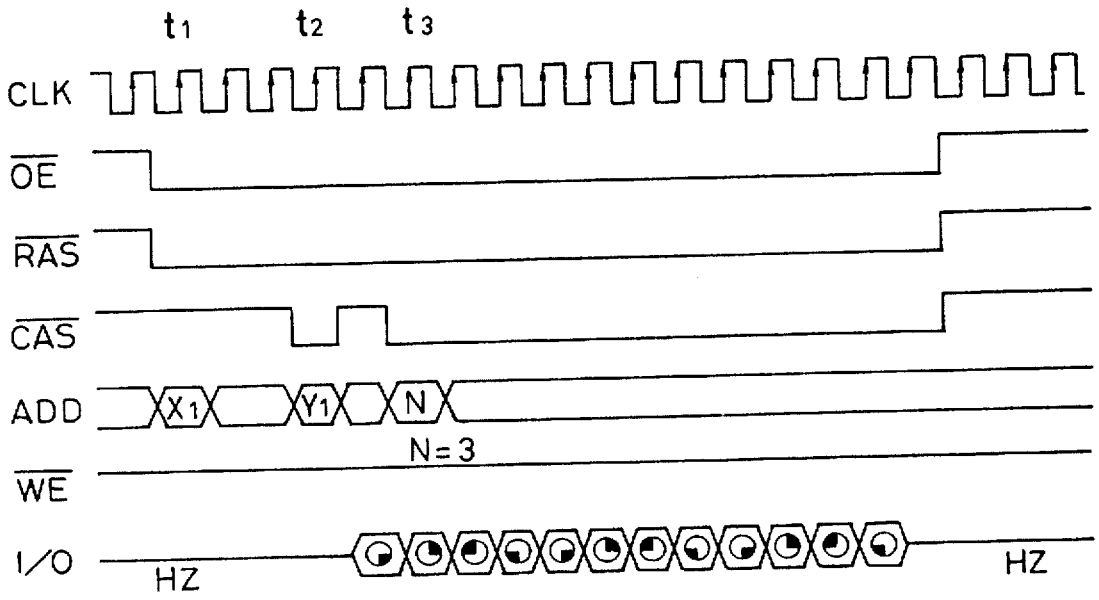
FIG. 9B is a timing diagram illustrating burst access to three blocks in FIG. 9A by the fourth novel memory.

FIG. 9B illustrates a burst read access for the fourth novel memory. The row address $X_1$ is latched at time $t_1$ and the column address $Y_1$ at time $t_2$. The address counting means 18 is preset with $Y_1$ in the most significant k+1 bits and zero in the two remaining bits. At the same time the down-counter 61 is cleared to zero.

The address counting means 18 now begins incrementing, generating column addresses that select individual bits in the memory cell array. In the first four clock cycles after $t_2$ the four bits in block $(X_1, Y_1)$ are selected for access, one after another; in the next four clock cycles the four bits in the block $(X_1, Y_1+1)$ are selected and accessed; then the four bits in the block $(X_1, Y_1+2)$ are selected and accessed.

In the meantime, in the next clock cycle after $t_2$ the processor drives $\overline{CAS}$ high; then it drives $\overline{CAS}$ low again and places an access count on the external address bus ADD, indicating the number of blocks to be accessed. In this example the access count is N=3. This value is transferred from the address buffer 31 to the most significant k+1 bits of the down-counter 61 at time $t_3$.

At the moment when this value is transferred from the address buffer 31 to the down-counter 61, the down-counter 61 has already decremented from zero to, for example, minus two: in binary notation, from $(00 \ldots 00000)_B$ to $(11 \ldots 11110)_B$. The value $(10)_B$ in the two least significant bits is left unaltered and the value three, or $(00 \ldots 011)_B$, is set in the other bits, so the complete value of the down-counter 61 becomes, for example, $(00 \ldots 01110)_B$ or fourteen.

The down-counter 61 is designed to generate a count-out signal when its count reaches a certain value: for example, the value three, or $(00 \ldots 00011)_b$, at which the most significant k+1 bits all become zero. This value should be selected so that it is reached when the requested number of blocks have been accessed. The count-out signal (referred to elsewhere as a fourth internal control signal) is sent via the signal line 64 to the address counting means 18 and the input/output control circuit 36 in FIG. 8, causing the address counting means 18 to stop counting and the input/output control circuit 36 to place the I/O port in the high-impedance state. After this, the processor drives $\overline{CAS}$ and other control signals inactive.

Write access is similar to read access except that $\overline{WE}$ is driven low instead of $\overline{OE}$.

The fourth novel memory has the same advantages as the first novel memory, with the following additional advantages.

In read access, the I/O port is placed in the high-impedance state as soon as the necessary number of bits have been accessed, even if the processor does not immediately deactivate $\overline{CAS}$ and other control signals. This feature is useful in a system having a shared data bus, since it enables the data bus to be transferred promptly to another device.

In write access, image-processing operations such as clip and fill can be carried out extremely conveniently. The access count can be used to control the number of bits written, thereby masking bits which are to be left unaltered.

In both read access and write access, the processor can control the number of bits accessed without having to deactivate $\overline{CAS}$ and other control signals at exact times.

The block address structure shown in FIG. 9A enables memory capacity to be increased without increasing either the number of external address lines $(A_o, \ldots, A_k)$ or the number of data lines in the I/O port, and furthermore enables access to begin even before the access count is received. Similar block structures can be employed in the first, second, and third novel memories.

The fourth novel memory can easily be adapted to block structures in which all bits in the same block are disposed in the same column and have the same column address $A_o, \ldots, A_m$, but are accessed in a serial manner by the input/output means. In this case k and m may be equal, the address counting means 18 being, for example, an (m+3)-bit counter that outputs only the m+1 most significant bits $A_o, \ldots, A_m$, so that the column address changes only once every four clock cycles.

The inventive concept of the fourth novel memory is also applicable to memories having a non-blocked address structure. In this case the start of data input or output may be delayed until the access count has been preset in the down-counter 61.

Figure 10:
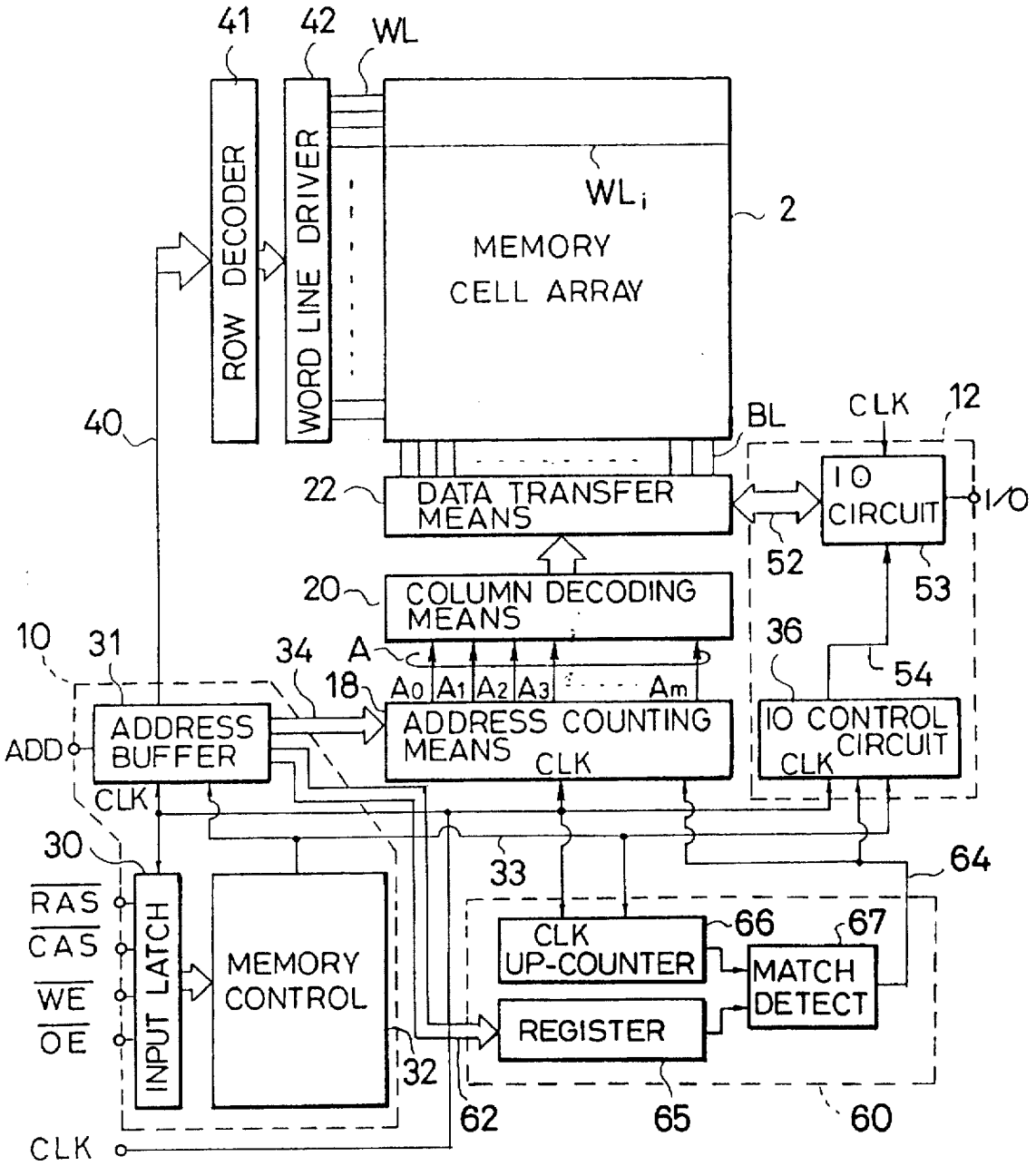
FIG. 10 is a block diagram of a fifth novel synchronous burst-access memory.

FIG. 10 is a block diagram of a fifth novel synchronous burst-access memory. Elements identical to elements in FIG. 8 are identified by the same reference numerals.

The fifth novel memory also has an access counting means 60 for counting accesses and halting input or output when a requested number of accesses have been performed. The difference from the fourth novel memory is that the access counting means 60 comprises a register 65, an up-counter 66, and a match detecting circuit 67, instead of the down-counter 63 in the fourth novel memory. The register 65 and up-counter 66 have the same bit width as the address counting means 18.

The register 65 is connected via the internal address bus 62 to the address buffer 31. As in the fourth novel memory, after $\overline{RAS}$ goes low, when $\overline{CAS}$ goes low for the first time, the memory control signal generating circuit 32 commands the address buffer 31 to send the current address value to the address counting means 18. When $\overline{CAS}$ goes low for the second time, the memory control signal generating circuit 32 commands the address buffer 31 to send the current address value to the register 65. In the case of a block-structured memory, the address values set the most significant k+1 bits of the address counting means 18 and the register 65. The register 65 stores the value received from the address buffer 31 until it receives a new value from the address buffer 31, and outputs the stored value to the match detecting circuit 67.

The up-counter 66 counts CLK cycles and outputs the count to the match detecting circuit 67. The up-counter 67 is reset to an initial value such as zero by a control signal generated by the memory control signal generating circuit 32 when $\overline{CAS}$ goes low for the first time after $\overline{RAS}$ goes low.

The match detecting circuit 67 is connected to the address counting means 18 and the input/output control circuit 36 via the signal line 64. The match detecting circuit 67 compares the count output by the up-counter 66 with the value received from the register 65. When this count and value match, the match detecting circuit 67 generates an internal control signal on the signal line 64. This internal control signal (also referred to as a fourth internal control signal) causes the address counting means 18 to stop counting, and the input/output control circuit 36 to place the input/output circuit 53 in the high-impedance state.

The operation of the fifth novel memory will be explained with reference to FIGS. 11A and 11B, which show two twelve-bit burst accesses.

Figure 11A:
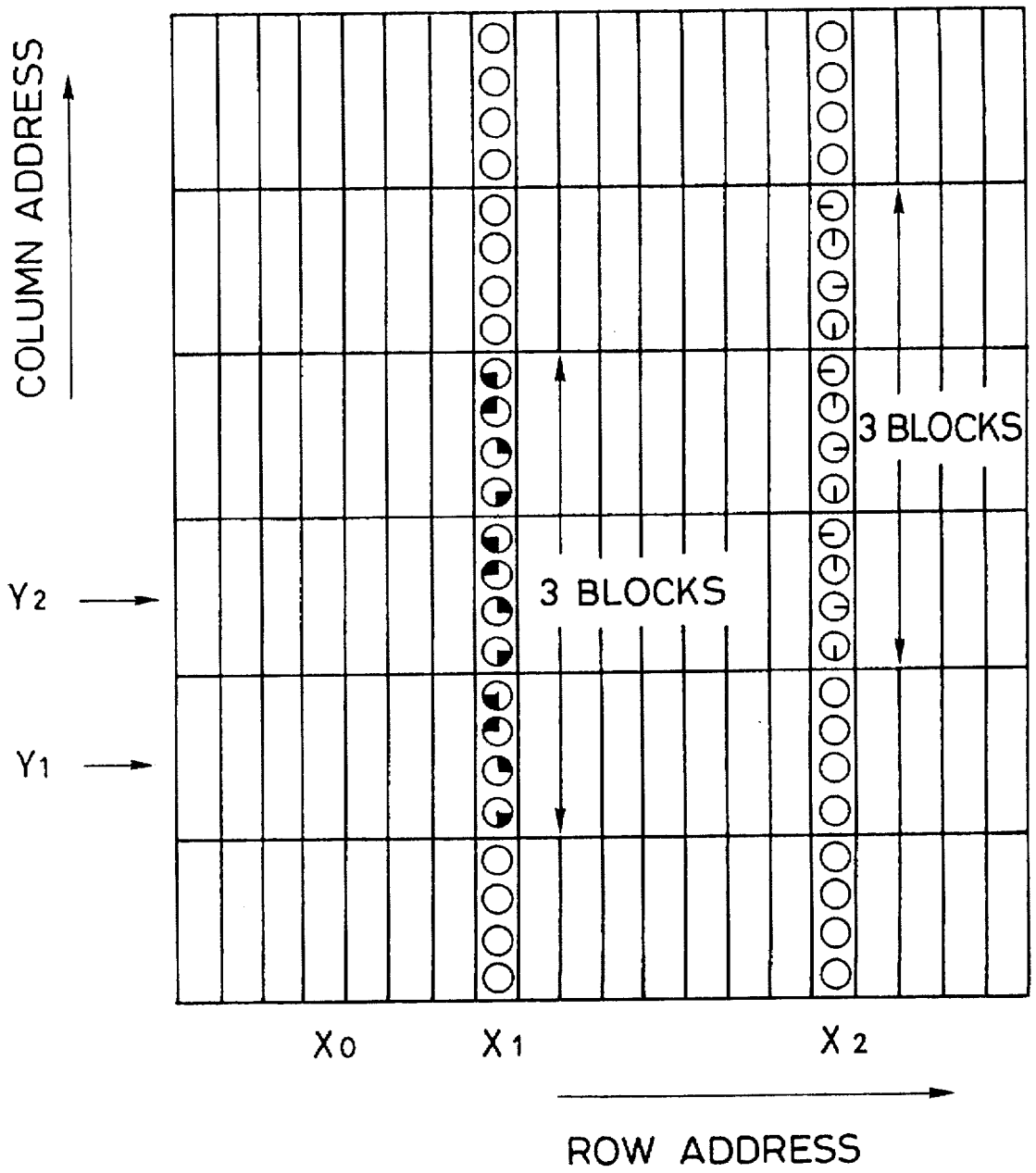
FIG. 11A illustrates two groups of three blocks each in the fifth novel memory.

As illustrated in FIG. 11A, the first twelve bits to be accessed are located in three consecutive blocks starting at row address $X_1$, column address $Y_1$. The second twelve bits are located in three consecutive blocks starting at row address $X_2$, column address $Y_2$.

Figure 11B:
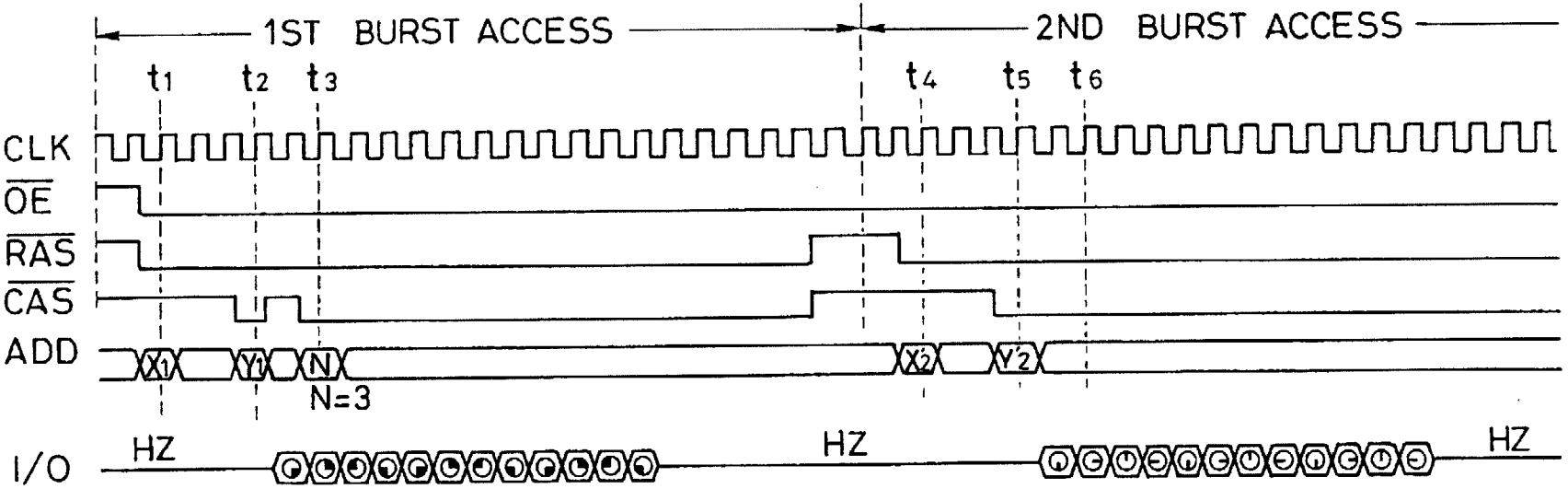
FIG. 11B is a timing diagram illustrating burst access to the blocks indicated in FIG. 11A by the fifth novel memory.

With reference to FIG. 11B, the processor first drives $\overline{RAS}$ low and sends the row address $X_1$, then drives $\overline{CAS}$ low and sends the column address $Y_1$. At time $t_2$ the column address $Y_1$ is passed from the address buffer 31 to the address counting means 18. At the same time, the up-counter 66 is cleared to zero. Output of data now begins as in FIG. 9B, with the up-counter 66 counting the number of bits output.

Next the processor drives $\overline{CAS}$ high for one CLK cycle, then drives $\overline{CAS}$ low again and sends the access block count (N=3). At time $t_3$ this count is sent from the address buffer 31 to the register 65 and stored in the most significant bits of the register 65. In this memory the bit width of the address counting means 18, the up-counter 66, and the register 65 is two greater than the bit width of the external address bus, so the value 3×4=12 is stored in the register 65.

When twelve data bits have been output, the output of the up-counter 66 matches the value stored in the register 65. Detecting this match, the match detecting circuit 67 generates a fourth internal control signal that forthwith halts the address counting means 18 and commands the input/output control circuit 36 to place the input/output circuit 53 in the high-impedance state.

At an appropriate later time the processor drives $\overline{RAS}$ and $\overline{CAS}$ high, ending the first access cycle. To access the second twelve bits, the processor next drives $\overline{RAS}$ low and sends a new row address $X_2$, then drives $\overline{CAS}$ low and sends a new column address. These new addresses are latched at times $t_3$ and $t_4$, respectively, and output of the data starting at address ($X_2$, $Y_2$) begins. At time $t_6$ the processor does not have to send the block count (N=3) again, because the old count is still held in the register 65. Accordingly, the processor continues to hold $\overline{CAS}$ low from time $t_5$ until the end of the access cycle. Once again, the memory outputs twelve bits, then halts output and places the input/output circuit 53 in the high-impedance state.

Write access is similar to read access except that $\overline{WE}$ is driven low instead of $\overline{OE}$.

The fifth novel memory provides the same advantages as the fourth, with the further advantage that when a processor performs repeated burst accesses of the same length, it only has to specify the length once. A further advantage is that if a processor neglects to specify an access length, because of a programming error for example, this will not in general cause the memory to attempt a burst access of the maximum length, because the previous length will be stored in the register 65 as a default value.

Figure 12:
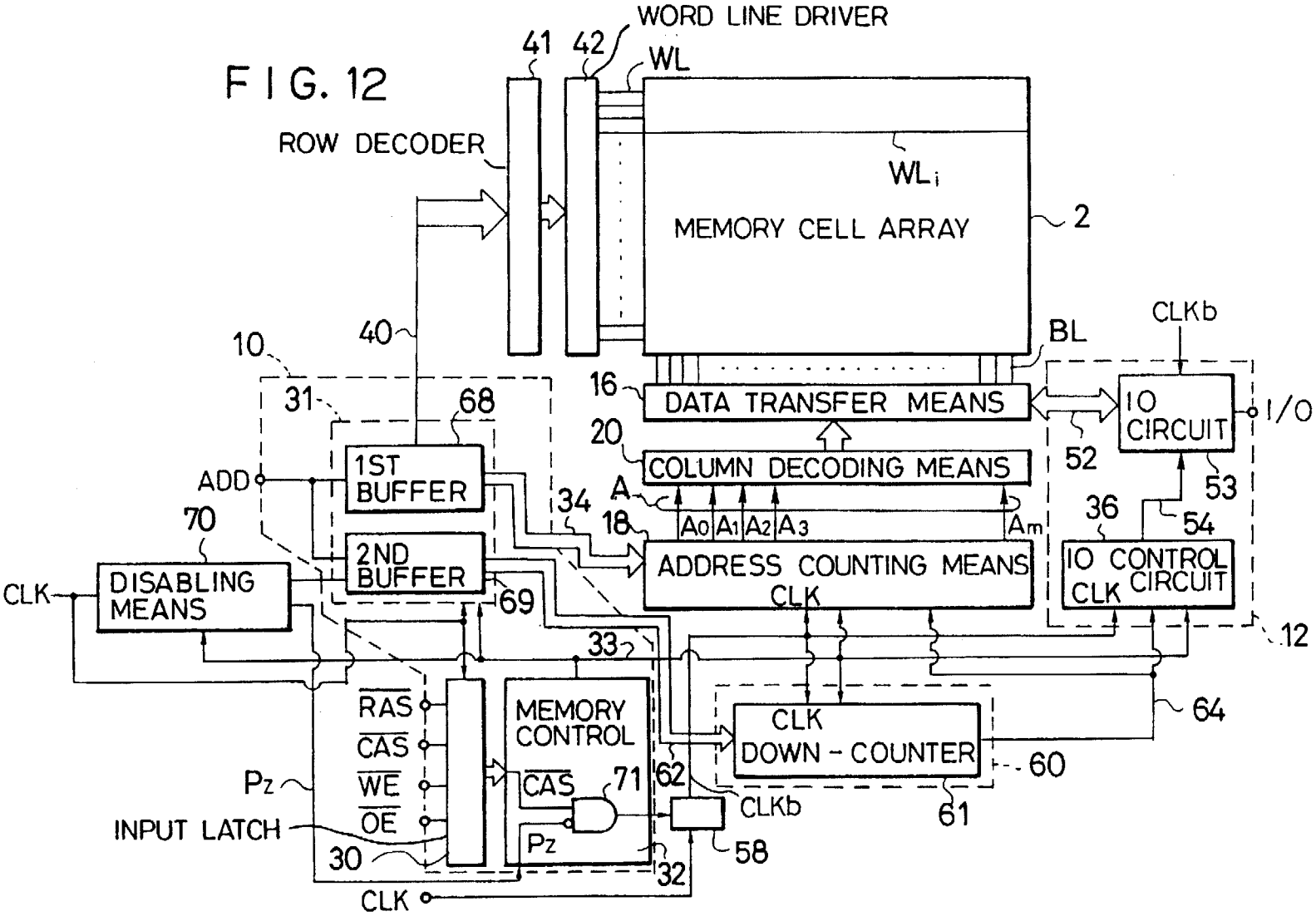
FIG. 12 is a block diagram of a sixth novel synchronous burst-access memory.

FIG. 12 is a block diagram of a sixth novel synchronous burst-access memory that combines the features of the third and fourth novel memories. Elements identical to elements in FIG. 8 are identified by the same reference numerals.

The sixth novel memory, like the fourth novel memory, has an access counting means 60 comprising a down-counter 61 for counting accesses and halting input or output when a requested count is reached.

The address buffer 31 in FIG. 12 is divided into a first buffer 68 and a second buffer 69. The first buffer 68 supplies a row address to the row address decoder 41 and a column address to the address counting means 18; the second buffer 69 supplies the value on the address bus ADD to the access counting means 60. These operations are performed as already described.

A disabling circuit 70 receives the clock signal CLK, sends control signals to the second buffer 69 and the memory control signal generating circuit 32, and receives a control signal from the memory control signal generating circuit 32. The disabling circuit 70 comprises, for example, a simple counter circuit. The function of the disabling circuit 70 is to enable the access counting means 60 to receive the value on the address bus only during a certain interval after $\overline{CAS}$ first becomes active following activation of $\overline{RAS}$.

When $\overline{CAS}$ goes low for the first time after $\overline{RAS}$ goes low, the memory control signal generating circuit 32 notifies the disabling circuit 70. On the first rising edge of CLK thereafter, the disabling circuit 70 enables the second buffer 69, activates a control signal Pz sent to the memory control signal generating circuit 32, and starts counting CLK cycles. When a certain count (three for example) is reached, the disabling circuit 70 disables the second buffer 69 and deactivates Pz. Here Pz is active high.

The sixth novel memory has a clock control circuit 58 similar to the one in the third novel memory for blocking clock input to the address counting means 18, the input/output control circuit 36, the input/output circuit 53, and the access counting means 60. The control signal sent from the memory control signal generating circuit 32 to the clock control circuit 58 is not $\overline{CAS}$, however, but a signal that blocks CLK only if $\overline{CAS}$ goes high while Pz is low. This signal can be generated, for example, by an AND gate 71 having $\overline{CAS}$ and the inverse of Pz as inputs.

Figure 13A:
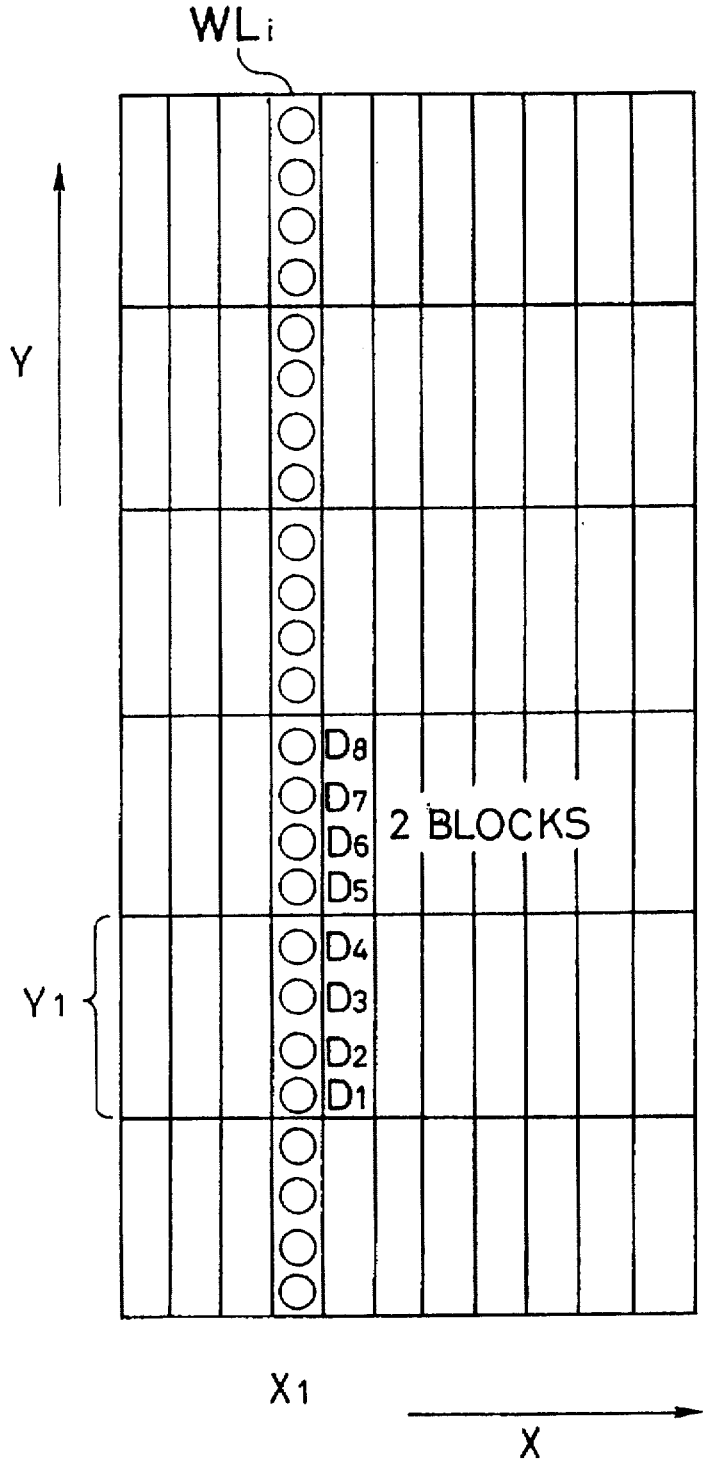
FIG. 13A illustrates two four-bit blocks in the sixth novel memory.

The memory cell array in FIG. 12 has the structure shown in FIG. 13A. Access to the two blocks comprising data $D_1$ to $D_8$ in FIG. 13A will be illustrated next.

Figure 13B:
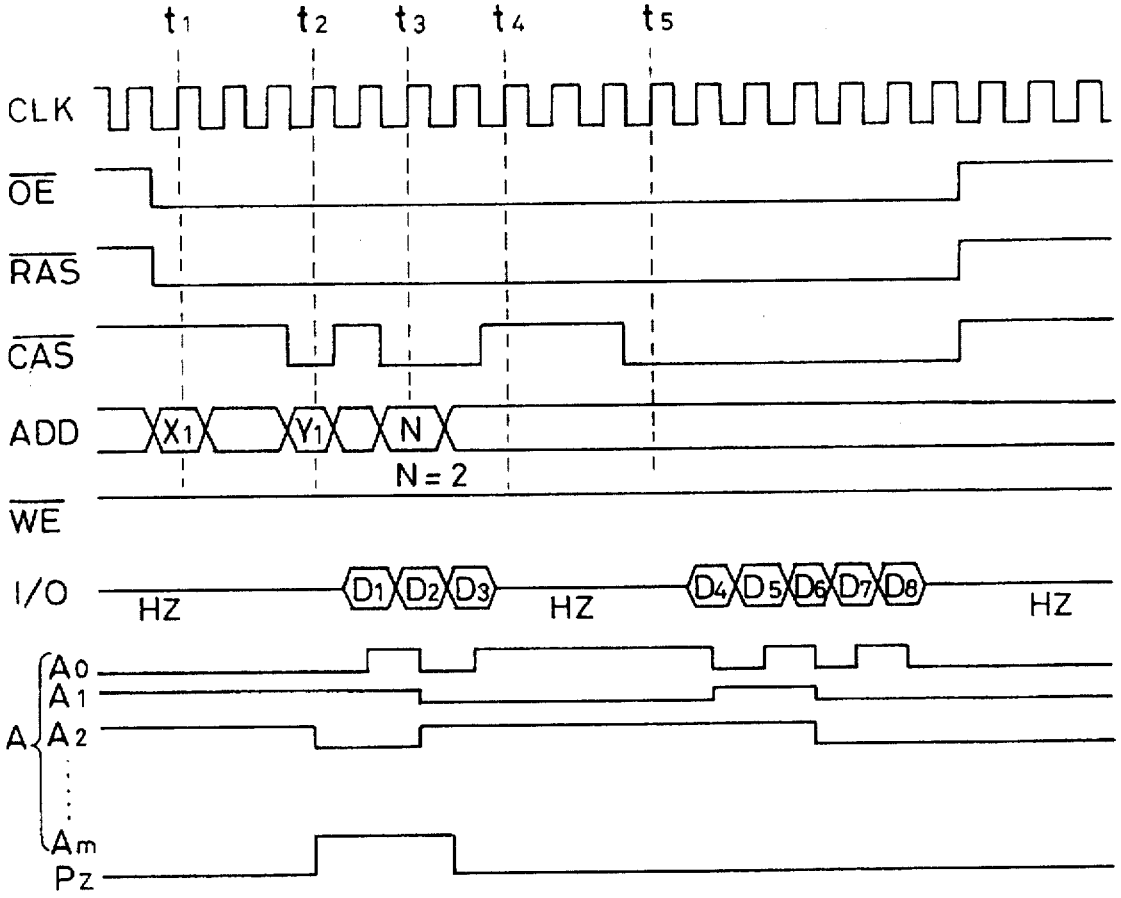
FIG. 13B is a timing diagram illustrating burst access to the blocks indicated in FIG. 13A by the fifth novel memory.

Referring to FIG. 13B, access begins as in the fourth and fifth novel memories, the row address $X_1$ being latched at time $t_1$ and the column address $Y_1$ being preset in the address counting means 18 at time $t_2$. At time $t_2$ the disabling means 70 enables the second buffer 69, permitting the block access count (N=2) to be transferred to the access counting means 60 at time $t_3$. Also at time $t_2$, the disabling means 70 drives the Pz signal high and starts counting CLK cycles.

$\overline{CAS}$ goes high for one clock cycle between times $t_2$ and $t_3$, but since Pz is high, $\overline{CAS}$ does not block CLK. The address counting means increments normally, and data output begins with $D_1$. Data output continues with $D_2$ and $D_3$ while $\overline{CAS}$ goes low again.

After counting three CLK cycles, the disabling means 70 drives the Pz signal low, permitting CLK to be gated by $\overline{CAS}$. Accordingly, if $\overline{CAS}$ subsequently goes high, as it does for three clock cycles around time $t_4$ for example, the address counting means 18 stops incrementing between times $t_4$ and $t_5$. During this interval the access counting means 60 also stops counting, the I/O port is placed in the high-impedance state on command from the memory control signal generating circuit 32, and access pauses.

Access resumes after time $t_5$, this being the first rising edge of CLK after $\overline{CAS}$ goes low again, and the remaining data $D_4, \ldots, D_8$ are output. When $D_8$ has been output, the access counting means 60 terminates the access by stopping the address counting means 18 and causing the I/O port to be placed in the high-impedance state again.

The sixth novel memory has the advantages of both the third and fourth novel memories: access can be temporarily halted by driving $\overline{CAS}$ high in order to allow another device to use the data bus; the data bus is released promptly when the requested number of bits have been accessed; and in write access, the access count can be used to mask bits in image-processing operations such as clip and fill.

Figure 14:
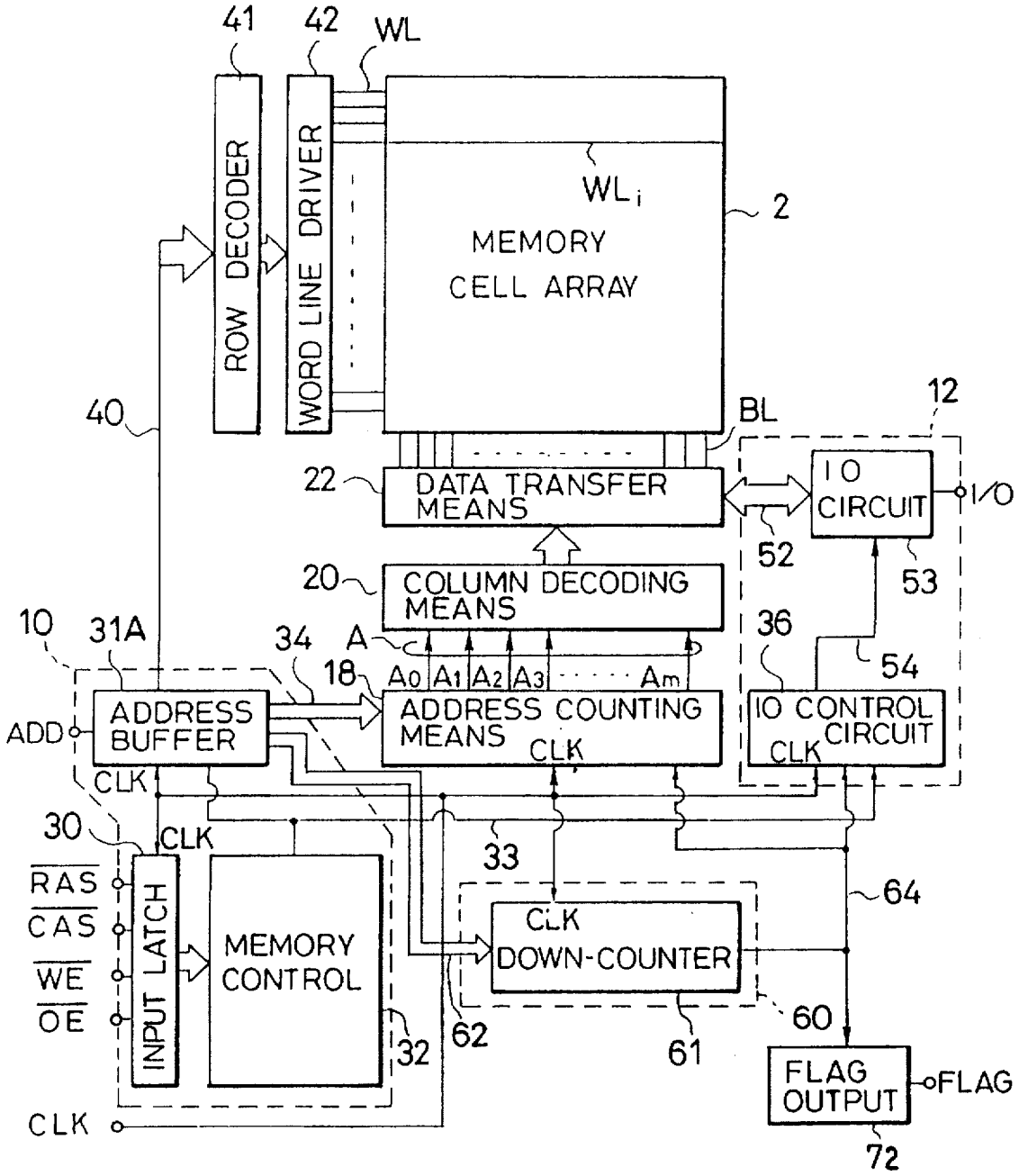
FIG. 14 is a block diagram of a seventh novel synchronous burst-access memory.

FIG. 14 is a block diagram of a seventh novel synchronous burst-access memory. Elements identical to elements in FIG. 8 are identified by the same reference numerals.

This seventh novel memory is similar to the fourth novel memory but has an additional flag output circuit 72 that also receives the signal output by the access clock counting means 60 on the signal line 64 when the requested number of accesses have been performed. On receiving this signal, the flag output circuit 72 asserts an external flag signal denoted FLAG in the drawings to notify external devices that the burst access has ended. The flag output circuit comprises, for example, a flip-flop circuit that is set by the signal from the access counting means 60 and reset (via a signal line not shown in the drawing) when $\overline{RAS}$ goes high.

Figure 15:
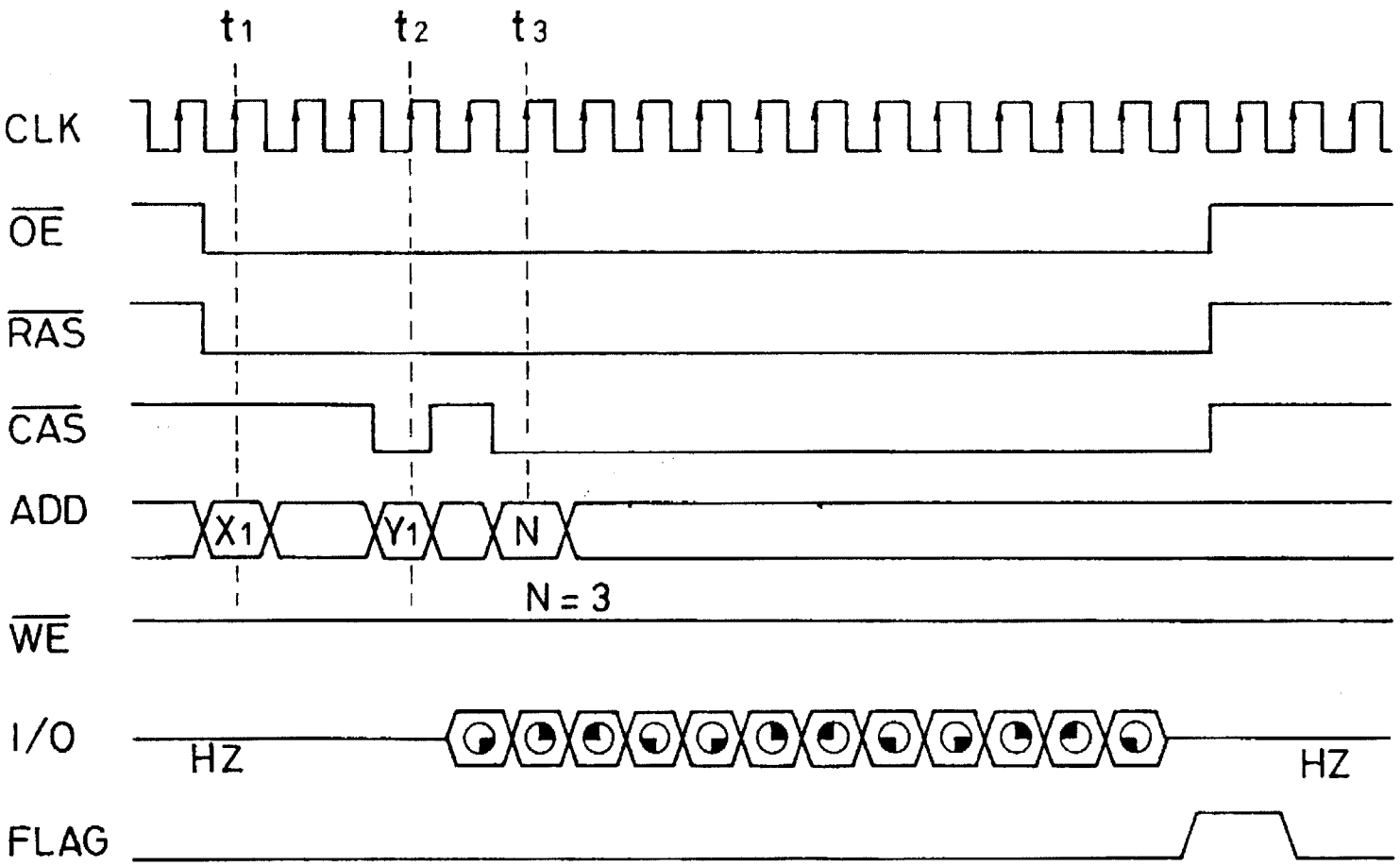
FIG. 15 is a timing diagram illustrating the operation of the seventh novel memory.

The operation of the seventh novel memory, illustrated in FIG. 15, is identical to the operation of the fourth novel memory illustrated in FIG. 9B with the addition of the flag output signal which goes high when a burst access is completed.

The advantage of the seventh novel memory is that a processor can delegate memory access to a memory management unit and execute other operations without having to count accessed bits. At the completion of memory access, the flag signal notifies the processor (or other external devices) that the memory is available to begin the next burst access.

Figure 16:
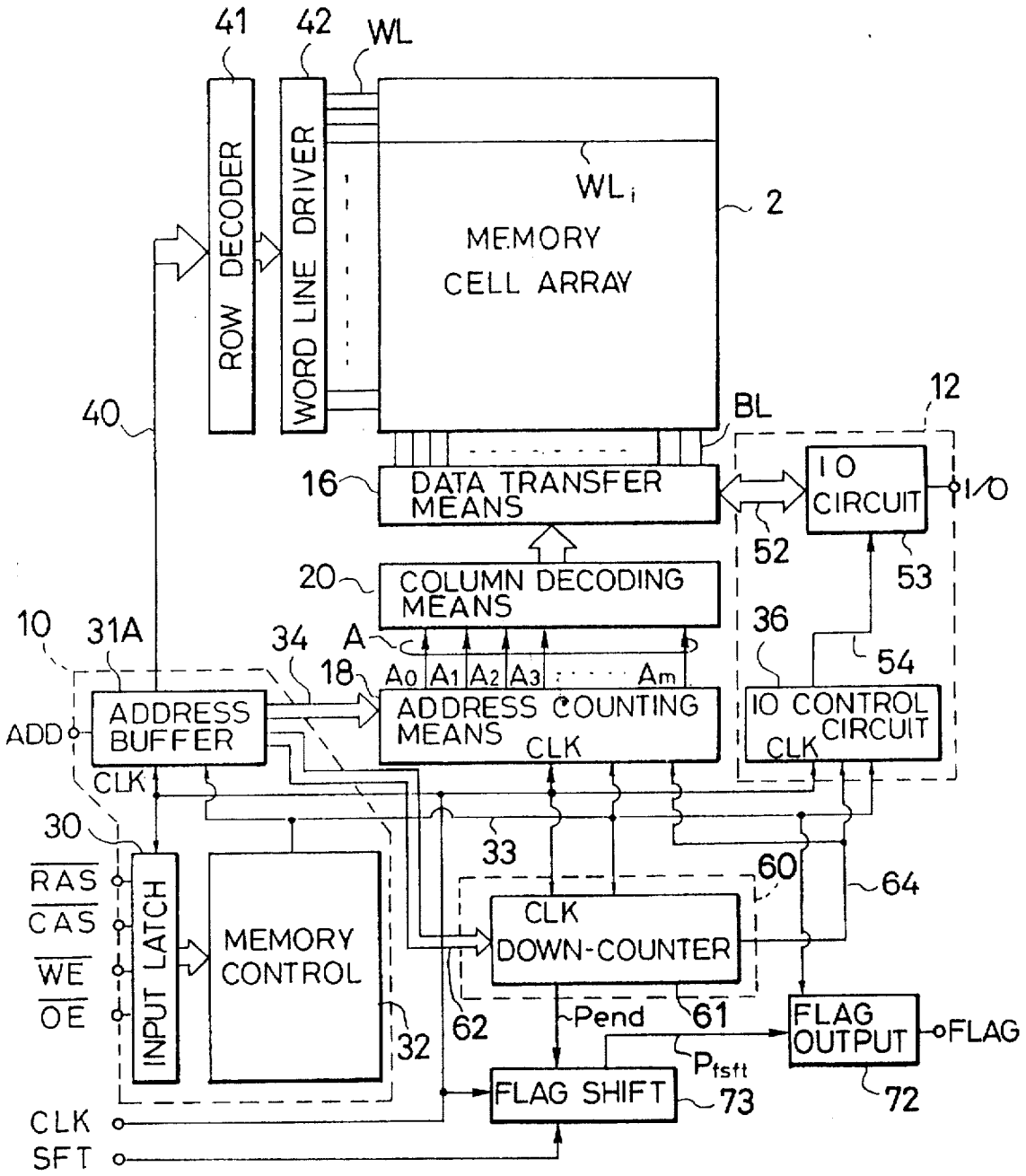
FIG. 16 is a block diagram of an eighth novel synchronous burst-access memory.

FIG. 16 is a block diagram of an eighth novel synchronous burst-access memory. Elements identical to elements in FIG. 14 are identified by the same reference numerals.

The access counting means 60 in FIG. 16 is adapted to generate a signal Pend that goes active a certain number of CLK cycles before the requested number of accesses have been completed. If the access counting means comprises a down-counter 61, for example, the Pend signal can be generated when a certain positive count is reached, this count being higher than the count value indicating completion of access.

The Pend signal is sent to a flag shifting circuit 73 and delayed by a certain time, the length of the delay being controlled, for example, by an externally input shift control signal denoted SFT. The delayed signal, denoted Pfsft in the drawings, is sent to the flag output circuit 72 and causes output of the flag signal.

Figure 17:
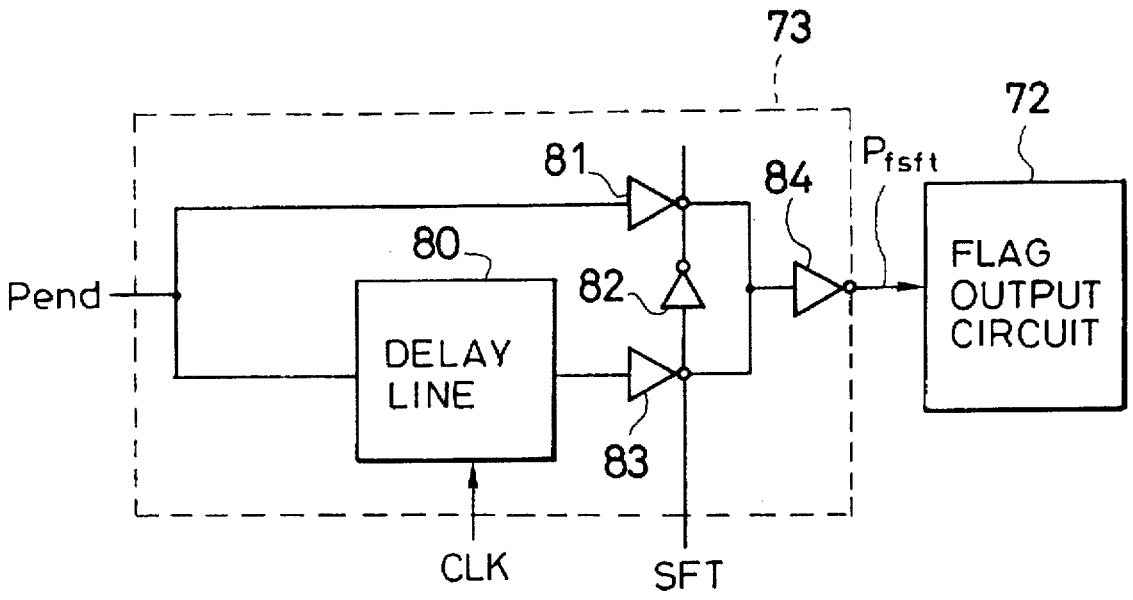
FIG. 17 is a schematic diagram of the flag shifting circuit in FIG. 16.

FIG. 17 is a schematic diagram of the flag shifting circuit 73 in FIG. 16, also showing the flag output circuit 72.

This flag shifting circuit 73 comprises an n-clock delay circuit 80 that receives the Pend and CLK signals and delays Pend by n CLK cycles, a tri-state buffer 81 that inputs Pend, an inverter 82 that inverts SFT, and a tri-state buffer 83 that receives the output of the n-clock delay circuit 80. The tri-state buffer 83 is enabled by the SFT signal; the tri-state buffer 81 is enabled by the inverted SFT signal created by the inverter 82. When enabled, both tri-state buffers 81 and 83 act as inverters. The output of whichever tri-state buffer 81 or 83 is enabled is inverted again by an inverter 84 to generate the output signal Pfsft which is sent to the flag output circuit 72.

Figure 18:
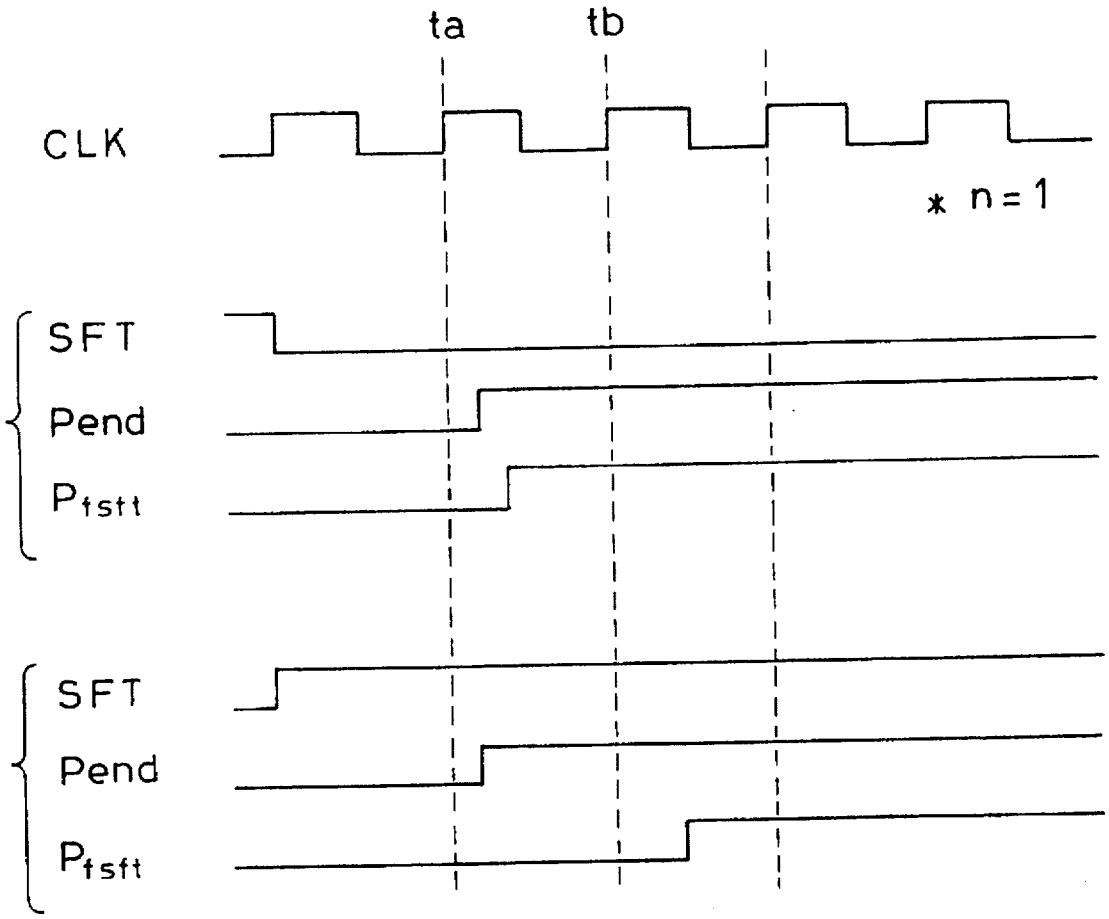
FIG. 18 is a timing diagram illustrating the operation of the flag-shifting circuit.

FIG. 18 is a timing diagram for the flag shifting circuit in FIG. 17, showing the case in which n=1. When SFT is low, Pfsft lags Pend by only the slight propagation delay of the tri-state buffer 81 and the inverter 84. When SFT is high, however, Pfsft lags Pend by substantially one CLK cycle, going high on the falling edge of CLK in the next CLK cycle after Pend goes high.

Figure 19:
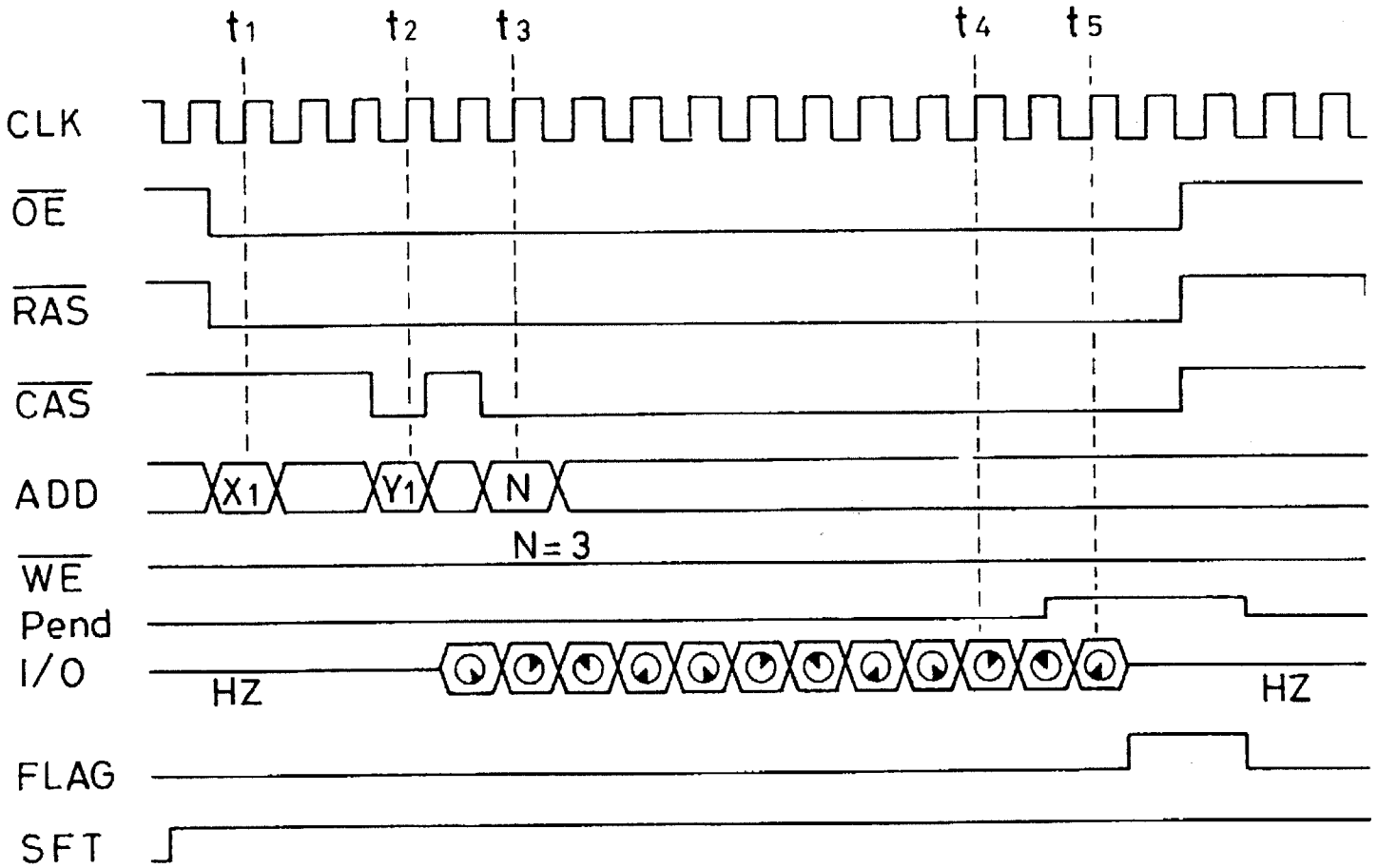
FIG. 19 is a timing diagram illustrating the operation of the eighth novel synchronous burst-access memory when the SFT signal is high.
Figure 20:
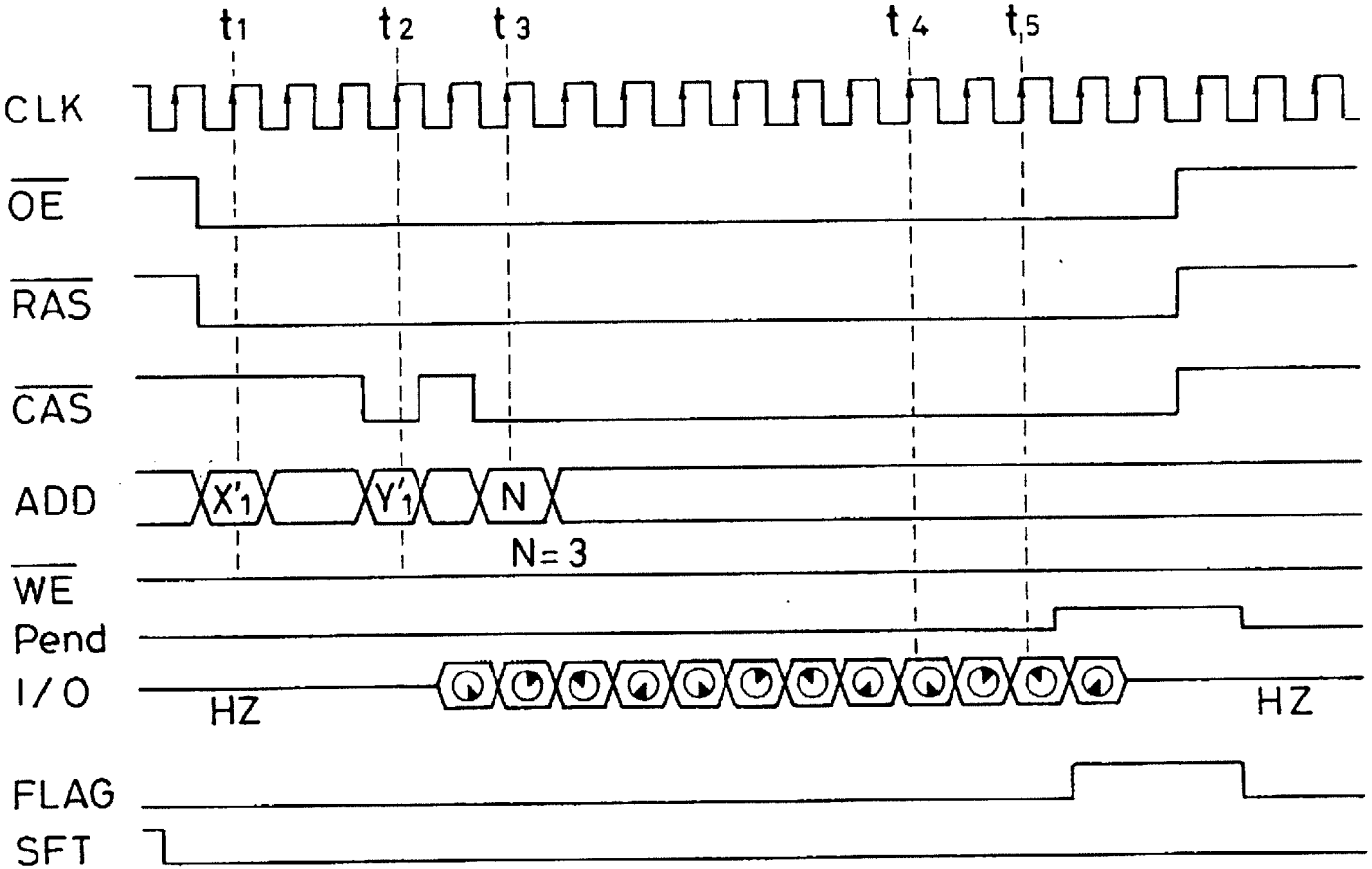
FIG. 20 is a timing diagram illustrating the operation of the eighth novel synchronous burst-access memory when the SFT signal is low.

FIGS. 19 and 20 illustrate the operation of the eighth novel memory when the access clock counter [63] *61* is adapted to drive Pend high during the penultimate access, and the flag shifting circuit of FIG. 17 is used. In FIG. 19 SFT is high, so flag output is delayed and occurs when access is actually completed. In FIG. 20 SFT is low, so flag output occurs one CLK cycle earlier.

To take prompt advantage of the availability of the data bus, some processors may need to be notified one or more clock cycles before the bus becomes available. The eighth novel memory is useful in such cases. Control of the timing of the notification (FLAG signal output) by the SFT input signal enables the memory to be easily adapted to the timing requirements of different processors.

Instead of having an externally input signal (SFT) select the Pend-to-FLAG delay, it is possible to make this selection on a permanent basis when the memory device is fabricated. The selection can be made by a manufacturing option such as a metalization mask option, laser trimming option, or bonding option.

It will be apparent that the features of the second through eighth novel memories can be combined in ways other than those shown above. The clock-frequency-dividing feature of the second novel memory, for example, can be added to any of the other novel memories, and the temporary access halting feature of the sixth novel memory can be combined with the flag output feature of the seventh novel memory, or the shifted flag output feature of the eighth novel memory.

The preceding description has dealt mainly with matters related to the column address strobe signal $\overline{CAS}$, column address, and access count, but a synchronous, high-speed burst-access memory using DRAM memory cells also requires novel circuitry for row-address latching and word-line driving. A novel word-line driving circuit, applicable to synchronous DRAM in general, will be described next with reference to FIG. 21.

Figure 21:
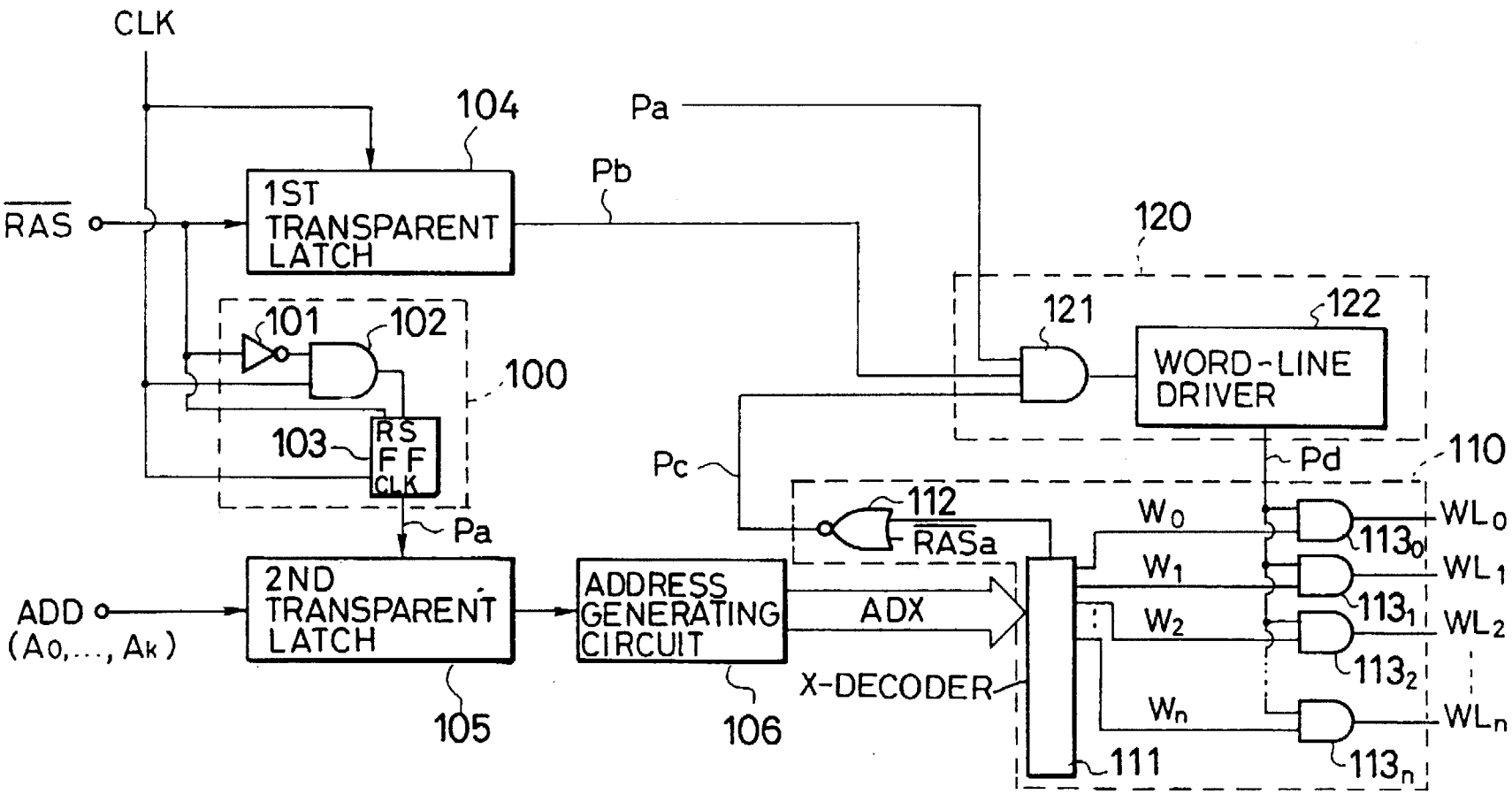
FIG. 21 is a block diagram of a novel word-line driving circuit for a synchronous dynamic memory.

The word-line driving circuit in FIG. 21 receives the clock signal CLK, the row address strobe signal $\overline{RAS}$, and address signals $(A_o, \ldots, A_k)$ from the external address bus ADD. A clock generating circuit 100 combines CLK and $\overline{RAS}$ to generate an address latch clock signal Pa that becomes active when CLK and $\overline{RAS}$ are both active, and remains active until $\overline{RAS}$ becomes inactive. Pa and CLK are active high, and $\overline{RAS}$ is active low.

The clock generating circuit 100 in FIG. 21 comprises, for example, an inverter 101 that receives and inverts $\overline{RAS}$, and AND gate 102 that ANDs the inverted $\overline{RAS}$ signal from the inverter 101 with the clock signal CLK, and a flip-flop circuit 103 having set and reset input terminals. The set terminal (marked S in the drawing) receives the output of the AND gate 102. The reset terminal (marked R) receives $\overline{RAS}$. The output of the flip-flop circuit 103 goes high when the S input is high and the R input is low, remains unchanged while the S and R inputs are both low, and goes low when the S input is low and the R input is high. Transitions in the output of the flip-flop circuit 103 are synchronized with the rising edge of the clock signal CLK, which is supplied to a clock input terminal of the flip-flop 103.

The clock generating circuit 100 need not be structured as shown in FIG. 21. Other circuit configurations can be used instead.

The word-line driving circuit in FIG. 21 also has a first transparent latch circuit 104 and a second transparent latch circuit 105. A transparent latch is a circuit having a data input, a clock input and a data output. While the clock input is inactive (low in the present case), the data output changes according to the data input. When the clock input becomes active (goes high in the present case), the data output latches at its current value and remains unchanged as long as the clock input stays active.

The first transparent latch circuit 104 receives $\overline{RAS}$ as its data input and CLK as its clock input, and generates a first internal signal Pb as its data output. Pb and $\overline{RAS}$ have opposite polarity, Pb going high when $\overline{RAS}$ goes low and vice versa.

The second transparent latch circuit 105 receives the address signals $A_o, \ldots, A_k$ as its data input and Pa as its clock input. The second transparent latch circuit 105 accordingly comprises a plurality of one-bit latches that are clocked in parallel by Pa.

The output of the second transparent latch circuit 105 is supplied via an address generating circuit 106 to a word-line decoding circuit 110. The address generating circuit 106 transfers the output of the second transparent latch circuit 105 to the word-line decoding circuit 110 as a row address (ADX).

The word-line decoding circuit 110 decodes the row address ADX, selects one of a plurality of word-lines $WL_o$ to $WL_n$, and generates a second internal signal Pc that becomes active when a word line has been selected. In FIG. 21 the word-line decoding circuit 110 comprises an X-decoder 111 that decodes the row address ADX and provides output signals to a NOR gate 112 and a plurality of AND gates $113_o, \ldots, 113_n$. The output signals $W_o, \ldots, W_n$ provided to the AND gates $113_o, \ldots, 113_n$ are the decoded address: as a result of decoding, the X-decoder 111 drives just one of the signals $W_o, \ldots, W_n$ high. The signal X provided to the NOR gate 112 is active low and signifies that the decoding operation has been completed; the signal X can be obtained from the signals $W_o, \ldots, W_n$ by NOR logic, for example.

The NOR gate 112 performs NOR logic on the signal X and a signal $\overline{RAS}$a having the same polarity as $\overline{RAS}$. The output of the NOR gate 112 is the second internal signal Pc, which thus goes high when $\overline{RAS}$ is low and the decoded address is valid, indicating that a word line has been selected.

The word-line decoding circuit 110 need not be structured as shown in FIG. 21. Other circuit configurations are also possible.

The first internal signal Pb, the second internal signal Pc, and a control signal are supplied to a gating and driving circuit 120. In FIG. 21 the control signal is the address latch clock signal Pa. The gating and driving circuit 120 gates the first internal signal Pb according to the second internal signal Pc and the control signal Pa to generate a drive signal Pd, which drives the word-line selected by the word-line decoding circuit 110.

The gating and driving circuit 120 in FIG. 21 comprises a three-input AND gate 121 and a word-line driver 122. The AND gate 121 receives Pa, Pb, and Pc as inputs, carries out a logical AND operation on these inputs, and sends the resulting output to the word-line driver 122. The drive signal Pd generated by the word-line driver 122 has the same polarity as the signal received from the AND gate 121. Pd is supplied to the AND gates $113_o, \ldots, 133_n$ in the word-line decoding circuit 110, and drives the word line $WL_i$ for which the corresponding signal $W_i$ from the X-decoder 111 is high.

The gating and driving circuit 120 need not be structured as shown in FIG. 21. For example, a control signal other than Pa can be used as the third input to the AND gate 121, or the output of the AND gate 121 can be used directly as the drive signal Pd, eliminating the word-line driver 122.

The operation of the word-line driving circuit in FIG. 21 will be described with reference to the timing diagram in FIG. 22.

Figure 22:
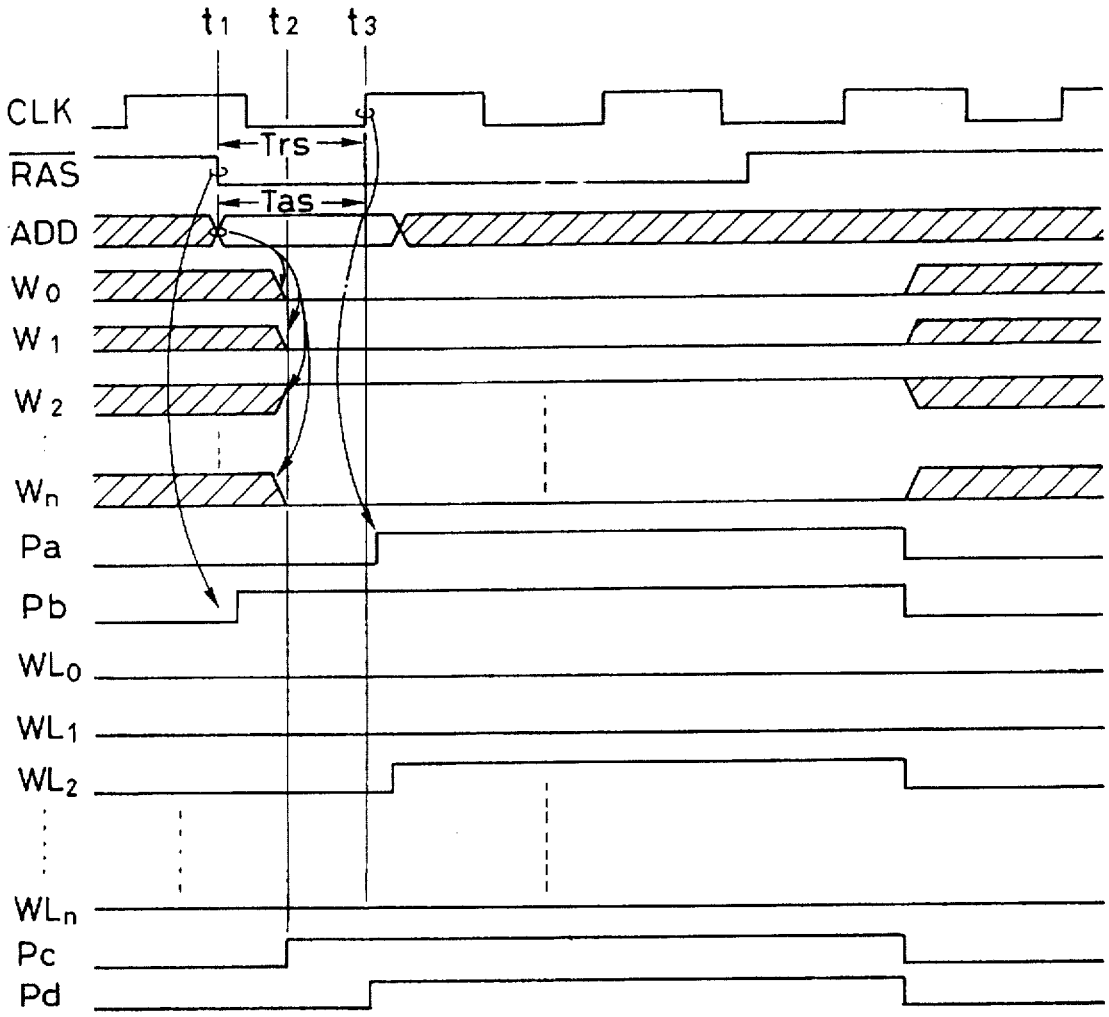
FIG. 22 is a timing diagram illustrating operation of the novel word-line driving circuit.

At the beginning of FIG. 22 the address latch clock signal Pa, the first and second internal signals Pb and Pc, and the drive signal Pd are all inactive (low). No word line is driven: $WL_o, \ldots, WL_n$ are all low. The outputs $W_o, \ldots, W_n$ of the X-decoder 111 are in an invalid state.

To begin an access cycle $\overline{RAS}$ is driven low and a valid row address is placed on the address bus ADD. $\overline{RAS}$ and ADD must satisfy setup times Trs and Tas with respect to the rising edge of CLK. Trs and Tas must be long enough for row address decoding to be completed and the first and second internal signals Pb and Pc to become active before the rise of CLK at time $t_3$. In FIG. 21 $\overline{RAS}$ goes low and ADD becomes valid before the preceding falling edge of CLK, but this is not a necessary condition. For example, $\overline{RAS}$ and ADD input can be synchronized with the falling edge of CLK, as shown in earlier timing diagrams such as FIG. 2.

After $\overline{RAS}$ becomes active (goes low) at time $t_1$ in FIG. 22, when CLK goes low to unlatch the first transparent latch circuit 104, the first internal signal Pb likewise becomes active (goes high). In the meantime, since Pa is low the second transparent latch circuit 105 is unlatched and passes the row address from the address bus ADD via the address generating circuit 106 to the X-decoder 111.

At a time $t_2$ prior to $t_3$, the X-decoder finishes decoding the row address and drives just one of the signals $W_o, \ldots, W_n$ to the high state. In FIG. 22, $W_2$ is driven high. At this time the second internal signal Pc also goes high, signifying that row address decoding and word-line selection have been completed. The word-line decoding device is now ready to drive the selected word line as soon as CLK rises.

When CLK rises at time $t_3$ the address latch clock signal Pa goes high, closing the second transparent latch circuit 105. The row address on the address bus ADD can now be replaced with another address, such as a column address, without changing the selected word line. In addition, since all three inputs to the AND gate 121 are high, the drive signal Pd goes high, driving the selected word line $WL_2$ high.

The use of transparent latches for $\overline{RAS}$ and the address signals enables row address decoding to be advanced into the clock cycle preceding the time $t_3$ at which $\overline{RAS}$ and the row address are latched. Word-line driving therefore begins almost immediately after the rise of CLK, the only delay being the short propagation delay of the AND gates $113_2$ and 121 and of the word-line driver 122.

Although word-line driving is synchronized with the rising edge of CLK in FIG. 22, it can of course be synchronized with the falling edge by using transparent latches that close when CLK is low, and making other obvious modifications to the circuits in FIG. 21.

What is claimed is:

1. A synchronous burst-access memory to receive a clock signal, a row address strobe signal, a column address strobe signal and address signals, comprising:

a memory cell array for storing data in memory cells disposed in intersecting rows and columns;

latching means for latching the row address strobe signal, the column address strobe signal, and address signals in synchronization with the clock signal, and for generating first and second internal control signals from the latched signals;

input/output means, coupled to said latching means, for external input and output of data in synchronization with said clock signal;

row address decoding means, coupled to said memory cell array, for decoding said address signals and selecting a row of memory cells in said memory cell array in response to the first internal control signal;

address counting means, preset to a value determined by said address signals in response to the second internal control signal, for counting said clock signal and generating a consecutive series of column addresses starting from the preset value;

column address decoding means coupled to said address counting means, for decoding said series of column addresses and selecting corresponding columns in said memory cell array;

data transfer means coupled to said memory cell array[,] *and* said input/output means[, and said address counting means,] for transferring data from said input/output means to said memory cell array and from said memory cell array to said input/output means, data being transferred to and from memory cells disposed in columns selected by said column address decoding means in the row selected by said row address decoding means; and access counting means, coupled to said address counting means and said input/output means, for counting *pulses of* said clock signal and generating a fourth internal control signal when a certain number of *pulses of* clock [signals] *signal* have been counted, said fourth internal control signal commanding said address counting means to cease generating column addresses and said input/output means to cease input and output.

2. The memory of claim 1, wherein said first internal control signal is generated from said row address strobe signal and said clock signal.

3. The memory of claim 1, wherein said second internal control signal is generated from said column address strobe signal and said clock signal.

4. The memory of claim 1, wherein said memory cells are dynamic memory cells.

5. The memory of claim 1, also comprising frequency-dividing means for dividing said clock signal in frequency before said clock signal is supplied to said latching means, said address counting means, and said input/output means.

6. The memory of claim 5, wherein said frequency-dividing means divides the frequency of said clock signal by an amount selected by an external control signal.

7. The memory of claim 5, wherein said frequency-dividing means divides the frequency of said clock signal by an amount selected by a manufacturing option.

8. The memory of claim 1, also comprising clock control means coupled to said latching means, for blocking input of said clock signal to said address counting means and said input/output means while said column address strobe signal is inactive.

9. The memory of claim 8, wherein said clock control means comprises an OR gate having said clock signal and said column address strobe signal as inputs.

10. The memory of claim 8, wherein said latching means generates a third internal control signal causing said input/output means to cease input and output when said column address strobe signal is inactive.

11. The memory of claim 1, wherein said number is determined by said address signals.

12. The memory of claim 11, wherein said access counting means receives said number from said latching means in synchronization with said clock signal when said column address strobe signal becomes active for a second time after said row address strobe signal becomes active.

13. The memory of claim 11, wherein said access counting means comprises a down-counter preset according to said number, for generating said fourth internal control signal when a certain count is reached.

14. The memory of claim 11, wherein said access clock counting means comprises:

an up-counter for counting said clock signal, thus generating a count value;

a register for storing said number; and a match-detecting circuit coupled to said counter and said register, for comparing said count value with the contents of said register and generating said fourth control signal when said count value matches said contents of said register.

15. The memory of claim 12, further comprising disabling means coupled to said latching means, for enabling said access counting means to receive said number from said latching means only during a certain interval after said column address strobe signal first becomes active following activation of said row address strobe signal.

16. The memory of claim 15, wherein said disabling means determines said interval by counting *the pulses of* said clock signal.

17. The memory of claim 15, further comprising clock control means coupled to said latching means, for blocking input of said clock signal to said address counting means and said input/output means when said column address strobe signal is inactive before and after but not during said interval.

18. The memory of claim 1, also comprising flag output means coupled to said access counting means, for generating a flag signal indicating completion of access.

19. The memory of claim 18, wherein said flag signal is generated when said access counting means has counted said number of *pulses of the* clock [signals] *signal*.

20. The memory of claim 18, wherein said flag signal is generated a certain time before said access counting means has counted said number of *pulses of the* clock [signals] *signal*.

21. The memory of claim 18, wherein said flag output means has flag shifting means for delaying output of said flag signal by a selectable amount of time.

22. The memory of claim 21, wherein said amount of time is selected by a manufacturing option.

23. The memory of claim 21, wherein said amount of time is selected by an external shift control signal.

24. The memory of claim 23, wherein said access clock counting means generates an ending signal a certain time before said number of clock signals have been counted, and said flag shifting means comprises:

a first tri-state buffer for receiving said ending signal from said access clock counting means;

a delay line for receiving said ending signal from said access clock counting means and generating a delayed ending signal;

a second tri-state buffer coupled to said delay line, for receiving said delayed ending signal from said delay line;

a first inverter coupled to said first tri-state buffer and said second tri-state buffer, for inverting said shift control signal at a point between said first tri-state buffer and said second tri-state buffer; and a second inverter coupled to said first tri-state buffer and said second tri-state buffer, for inverting either a first output signal of said first tri-state buffer or a second output signal of said second tri-state buffer in response to said shift control signal and generating a third output signal sent to said flag output circuit;

said first tri-state buffer being enabled by said inverted shift control signal by said first inverter;

said second tri-state buffer being enabled by said shift control signal; and when enabled, both said first tri-state buffer and said second tri-state buffer acting as inverters.

25. A memory device to receive a clock signal and first and second strobe signals, comprising:

input/output circuit means for external input and output of data;

a memory cell array having a plurality of memory cell groups, said memory cell groups each having a plurality of memory cells respectively to store data therein;

address buffer means for receiving external address information, said address buffer means outputting a first internal address value in response to said first strobe signal and outputting a second internal address value in response to said second strobe signal;

first decoder means, responsive to said first internal address value, for selecting one of said memory cell groups;

address counter means, responsive to said clock signal, for generating consecutive address values starting from said second internal address value;

second decoder means for selecting one of the memory cells in said selected memory cell group in response to each of said consecutive address values;

data transfer circuit means for consecutively transferring data from said input/output circuit means to said selected memory cell and from said selected memory cell to said input/output circuit means; and access counting circuit means for counting *pulses of* said clock signal and generating an internal control signal to said address counter means so as to cause said address counter means to cease generating said consecutive address values when a certain number of *pulses of said* clock [signals] *signal* have been counted.

26. The memory device according to claim 25, wherein said first strobe signal defines a first accessible period in every read/write cycle; and wherein said second strobe signal defines second and third accessible periods within the first accessible period defined by said first strobe signal; said first internal address value being outputted from said address buffer means at the beginning of said first accessible period; said second internal address value being outputted from said address buffer means at the beginning of said second accessible period.

27. The memory device according to claim 26, wherein said address buffer means further comprises means for outputting a third internal address value based upon said external address information at the beginning of said third accessible period; said third internal address value indicating the number *of pulses* of clock [signals] *signal* to be counted by said access counting circuit means.

28. A memory device to receive a clock signal and first and second strobe signals, said first strobe signal defining a first accessible period in every read/write cycle, said second strobe signal defining second and third accessible periods within the first accessible period defined by said first strobe signal, said memory device comprising:

input/output circuit means for external input and output of data;

a memory cell array having a plurality of memory cell groups, said memory cell groups each having a plurality of memory cells respectively to store data therein;

address buffer means for receiving external address information, said address buffer means outputting a first internal address value in response to said first strobe signal and outputting a second internal address value in response to said second strobe signal;

first decoder means, responsive to said first internal address value, for selecting one of said memory cell groups;

address counter means, responsive to said clock signal, for generating consecutive address values starting from said second internal address value, said address counter means stopping generating consecutive address values during an inaccessible period between said second and third accessible periods;

second decoder means for selecting one of the memory cells in said selected memory cell group in response to each of said consecutive address values; and data transfer circuit means for consecutively transferring data from said input/output circuit means to said selected memory cell and from said selected memory cell to said input/output circuit means.

*29. A synchronous burst-access memory to receive a clock signal, a row address strobe signal, a column address strobe signal and address signals, comprising:*

*a memory cell array having a plurality of memory cells each of which stores data therein;*

*a latch circuit receiving the row address strobe signal, the column address strobe signal and the address signals in synchronization with the clock signal, said latch circuit generating first and second internal control signals from the received signals;*

*an input/output circuit coupled to said latch circuit, said input/output circuit receiving and outputting data in synchronization with the clock signal;*

*a row address decoder coupled to said memory cell array, said row address decoder selecting a row of the memory cells in said memory cell array in response to the first internal control signal;*

*an address counter coupled to said latch circuit, said address counter generating a consecutive series of column addresses starting from a preset address determined by the address signals and the second internal control signal;*

*a column address decoder coupled to said address counter, said column address decoder selecting corresponding columns in said memory cell array in response to the consecutive series of column addresses;*

*a data transfer circuit coupled to said memory cell array and said input/output circuit, said transfer circuit transferring data from said input/output circuit to said memory cell array and from said memory cell array to said input/output circuit, data being transferred to and from memory cells disposed in columns selected by said column address decoder and in the row selected by said row address decoder; and*

*an access counter coupled to said address counter and said input/output circuit, said access counter generating a fourth internal control signal when a certain number of pulses of the clock signal have been counted thereby, said fourth internal control signal commanding said address counter to cease generating column addresses and said input/output circuit to cease inputting and outputting.*

*30. A synchronous burst-access memory according to claim 29, wherein said first internal control signal is generated from said row address strobe signal and said clock signal.*

*31. A synchronous burst-access memory according to claim 29, wherein said latch circuit comprises:*

*an input latch circuit receiving the clock signal, the row address strobe signal and the column address strobe signal; and*

*an address buffer receiving the clock signal and address signals.*

*32. A synchronous burst-access memory according to claim 29, wherein said second internal control signal is generated from said column address strobe signal and said clock signal.*

*33. A synchronous burst-access memory according to claim 29, further comprising a clock control circuit coupled to said latch circuit, said clock control circuit blocking input of the clock signal to said address counter and said input/output circuit while said column address strobe signal is inactive.*

*34. A synchronous burst-access memory according to claim 33, wherein said clock control circuit comprises a gate circuit receiving the clock signal and the column address strobe signal.*

*35. A synchronous burst-access memory according to claim 29, wherein said latch circuit generates a third internal control signal causing said input/output circuit to cease input and output when the column address strobe signal is inactive.*

*36. A synchronous burst-access memory according to claim 29, wherein said access counter comprises a down-counter generating said fourth internal control signal when a certain count is reached.*

*37. A synchronous burst-access memory according to claim 29, wherein said access counter comprises:*

*an up-counter counting the clock signal and generating a count value signal;*

*a register coupled to said latch circuit, the register receiving a current address value signal from the latch circuit; and*

*a match-detecting circuit coupled to the up-counter and register, the match-detecting circuit comparing the count value signal with the current address value signal and generating the fourth control signal when the count value matches the current address value signal.*

*38. A synchronous burst-access memory according to claim 29, further comprising a disabling circuit coupled to said latch circuit, the disabling circuit controlling said access counter to receive the signal from said latch circuit only during a certain interval after said column address strobe signal first becomes active following activation of said row address strobe signal.*

*39. A synchronous burst-access memory according to claim 38, wherein the disabling circuit determines the interval by counting the pulses of clock signal.*

*40. A synchronous burst-access memory according to claim 38, further comprising a clock control circuit coupled to said latch circuit, the clock control circuit blocking input of the clock signal to said address counter and input/output circuit when the column address strobe signal is inactive before and after but not during said interval.*

*41. A synchronous burst-access memory according to claim 29, further comprising a flag output circuit coupled to said access counter, the flag output circuit generating a flag signal indicating completion of access.*

*42. A synchronous burst-access memory according to claim 41, wherein the flag signal is generated when said access counter has counted the number of pulses of the clock signal.*

*43. A synchronous burst-access memory according to claim 41, wherein said flag signal is generated a certain time before said access counter has counted said number of pulses of the clock signal.*

*44. A synchronous burst-access memory according to claim 41, wherein the flag output circuit includes a flag shifting circuit delaying output of the flag signal by a selectable amount of time.*

*45. A memory device to receive a clock signal and first and second strobe signals, comprising:*

*an input/output circuit;*

*a memory cell array having a plurality of memory cell groups, the memory cell groups each having a plurality of memory cells respectively to store data therein;*

*an address buffer receiving external address signals, said address buffer outputting a first internal address signal in response to the first strobe signal and outputting a second internal address signal in response to the second strobe signal;*

*a first decoder selecting one of the memory cell groups in response to the first internal address signal;*

*an address counter generating consecutive address signals starting from the second internal address signal in response to the clock signal;*

*a second decoder selecting one of the memory cells in the selected memory cell group in response to each of the consecutive address signals;*

*a data transfer circuit consecutively transferring data from said input/output circuit to the selected memory cell and from the selected memory cell to the input/output circuit; and*

*an access counter counting pulses of the clock signal and generating an internal control signal to said address counter so as to cause said address counter to cease generating the consecutive address signals when a certain number of pulses of the clock signal have been counted.*

*46. A memory device according to claim 45, further comprising a latch circuit having:*

*an input latch circuit receiving the clock signal, the row address strobe signal and the column address strobe signal; and*

*an address buffer receiving the clock signal and address signals.*

*47. A memory device according to claim 45, further comprising a latch circuit and a clock control circuit*

*coupled to said latch circuit, said clock control circuit blocking input of the clock signal to said address counter and said input/output circuit while said column address strobe signal is inactive.*

*48. A memory device according to claim 47, wherein said clock control circuit comprises a gate circuit receiving the clock signal and the column address strobe signal.*

*49. A memory device according to claim 45, further comprising a latch circuit wherein said latch circuit generates a third internal control signal causing said input/output circuit to cease input and output when the column address strobe signal is inactive.*

*50. A memory device according to claim 45, wherein said access counter comprises a down-counter generating a fourth internal control signal when a certain count is reached.*

*51. A memory device according to claim 45, further comprising a latch circuit; and wherein said access counter comprises:*

*an up-counter counting the clock signal and generating a count value signal;*

*a register coupled to said latch circuit, the register receiving a current address value signal from the latch circuit; and*

*a match-detecting circuit coupled to the up-counter and register, the match-detecting circuit comparing the count value signal with the current address value signal and generating the fourth control signal when the count value matches the current address value signal.*

*52. A memory device according to claim 45, further comprising a latch circuit and a disabling circuit coupled to said latch circuit, the disabling circuit controlling said access counter to receive the signal from said latch circuit only during a certain interval after said column address strobe signal first becomes active following activation of said row address strobe signal.*

*53. A memory device according to claim 52, wherein the disabling circuit determines the interval by counting the pulses of said clock signal.*

*54. A memory device according to claim 52, further comprising a latch circuit and a clock control circuit coupled to said latch circuit, the clock control circuit blocking input of the clock signal to said address counter and input/output circuit when the column address strobe signal is inactive before and after but not during said interval.*

*55. A memory device according to claim 45, further comprising a flag output circuit coupled to said access counter, the flag output circuit generating a flag signal indicating completion of access.*

*56. A memory device according to claim 55, wherein the flag signal is generated when said access counter has counted the number of pulses of the clock signal.*

*57. A memory device according to claim 55, wherein said flag signal is generated a certain time before said access counting means has counted said number of pulses of the clock signal.*

*58. A memory device according to claim 55, wherein the flag output circuit includes a flag shifting circuit delaying output of the flag signal by a selectable amount of time.*

*59. A memory device to receive a clock signal and first and second strobe signals, said first strobe signal defining a first accessible period in every read/write cycle, said second strobe signal defining second and third accessible periods within the first accessible period defined by said first strobe signal, said memory device comprising:*

*an input/output circuit;*

*a memory cell array having a plurality of memory cell groups, said memory cell groups each having a plurality of memory cells respectively to store data therein;*

*an address buffer receiving external address signals, said address buffer outputting a first internal address signal in response to said first strobe signal and outputting a second internal address signal in response to said second strobe signal;*

*a first decoder selecting one of said memory cell groups in response to the first internal address signal;*

*an address counter generating consecutive address signals starting from the second internal address signal in response to the clock signal, said address counter stopping generating consecutive address signals during an inaccessible period between the second and third accessible periods;*

*a second decoder selecting one of the memory cells in said selected memory cell group in response to each of said consecutive address signals; and*

*a data transfer circuit consecutively transferring data from said input/output circuit to said selected memory cell and from said selected memory cell to said input/output circuit.*

* * * * *